United States Patent [19]

Ishihara

[11] Patent Number: 5,313,299
[45] Date of Patent: May 17, 1994

[54] SCAN CONVERTER CONTROL CIRCUIT HAVING MEMORIES AND ADDRESS GENERATOR FOR GENERATING ZIGZAG ADDRESS SIGNAL SUPPLIED TO THE MEMORIES

[75] Inventor: Teruo Ishihara, Kawasaki, Japan

[73] Assignee: Fujitsu Limited, Kawasaki, Japan

[21] Appl. No.: 561,826

[22] Filed: Aug. 2, 1990

[30] Foreign Application Priority Data

Aug. 2, 1989 [JP] Japan .................................. 1-199362
Mar. 20, 1990 [JP] Japan .................................. 2-71231

[51] Int. Cl.⁵ ........................ H04N 5/14; H04N 7/12
[52] U.S. Cl. ................... 348/714; 365/189.04; 348/403
[58] Field of Search ............... 358/404, 443, 444, 452, 358/448, 160, 140, 133; 364/725; 365/189.01, 230.01, 189.04

[56] References Cited

U.S. PATENT DOCUMENTS

| 4,573,080 | 2/1986 | Maze | 358/160 X |
| 4,672,446 | 6/1987 | Ikeda et al. | 358/140 |
| 4,845,669 | 7/1989 | Chappell et al. | 365/189.04 |
| 4,868,656 | 9/1989 | Geiger et al. | 358/160 X |
| 4,875,196 | 10/1989 | Spaderna et al. | 365/189.04 |
| 4,893,279 | 1/1990 | Rahman et al. | 365/189.04 |
| 4,918,527 | 4/1990 | Penard et al. | 364/725 X |
| 4,953,020 | 8/1990 | De With | 358/135 X |
| 4,958,229 | 9/1990 | Guillon et al. | 358/160 X |

FOREIGN PATENT DOCUMENTS

| 0211565 | 2/1987 | European Pat. Off. . |
| 0250976 | 1/1988 | European Pat. Off. . |
| 0253956 | 1/1988 | European Pat. Off. . |
| 62086 | 8/1989 | Japan | H04N 5/265 |

OTHER PUBLICATIONS

Patent Abstracts of Japan, vol. 7, No. 274 (P-241) Dec. 7, 1983 & JP-A-58 151 670 (Hitachi) Sep. 8, 1983 *the whole document*.

PCT International Publicaiton No. WO 85/02935, Abstract; p. 5, line 14-p. 7, line 32; p. 9, lines 23-35; FIG. 2, Jul. 1985.

Primary Examiner—Victor R. Kostak
Attorney, Agent, or Firm—Staas & Halsey

[57] ABSTRACT

A scan converter control circuit includes first and second memories, each having a data write mode and a data read mode which are selected in response to a switching signal so that the first memory is in the data write mode when the second memory is in the data read mode and the first memory is in the data read mode when the second memory is in the data write mode. A write address counter generates a write address which is to be alternately supplied to the first and second memories and generates a write completion signal when the write address becomes equal to a predetermined count value. A read address counter generates a read address which is to be alternately supplied to the first and second memories and generates a read completion signal when the read address becomes equal to a predetermined count value. A data input controller enables the write address counter in response to a data input signal supplied from an external circuit and disables the write address counter when receiving the write completion signal. A memory switching controller generates the switching signal having a logic value which is changed in response to the write completion signal. A data output controller enables the read address counter in response to the write completion signal and disables the read address counter in response to the read completion signal.

11 Claims, 16 Drawing Sheets

FIG. 2A
PRIOR ART
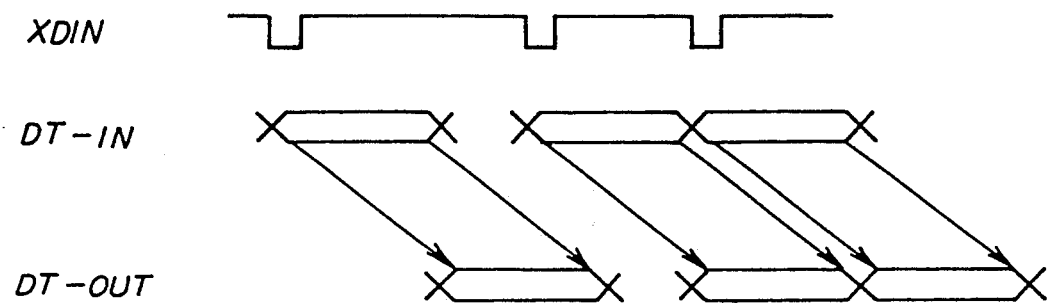
FIG. 2B
PRIOR ART
WRITING ORDER
| 0 | 8  | 16 | 24 | 32 | 40 | 48 | 56 |
|---|----|----|----|----|----|----|----|
| 1 | 9  | 17 | 25 | 33 | 41 | 49 | 57 |
| 2 | 10 | 18 | 26 | 34 | 42 | 50 | 58 |
| 3 | 11 | 19 | 27 | 35 | 44 | 51 | 59 |
| 4 | 12 | 20 | 28 | 36 | 45 | 52 | 60 |
| 5 | 13 | 21 | 29 | 37 | 46 | 53 | 61 |
| 6 | 14 | 22 | 30 | 38 | 47 | 54 | 62 |
| 7 | 15 | 23 | 31 | 40 | 48 | 55 | 63 |
READING ORDER
| 0  | 2  | 3  | 9  | 10 | 20 | 21 | 35 |
|----|----|----|----|----|----|----|----|
| 1  | 4  | 8  | 11 | 19 | 22 | 34 | 36 |
| 5  | 7  | 12 | 18 | 23 | 33 | 37 | 48 |
| 6  | 13 | 17 | 24 | 32 | 38 | 47 | 49 |
| 14 | 16 | 25 | 31 | 39 | 46 | 50 | 57 |
| 15 | 26 | 30 | 40 | 45 | 51 | 56 | 58 |
| 27 | 29 | 41 | 44 | 52 | 55 | 59 | 62 |
| 28 | 42 | 43 | 53 | 54 | 60 | 61 | 63 |
FIG. 2C
PRIOR ART
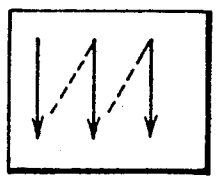 VERTICAL SCAN
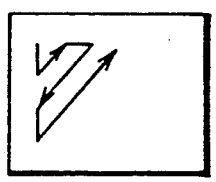 ZIGZAG SCAN

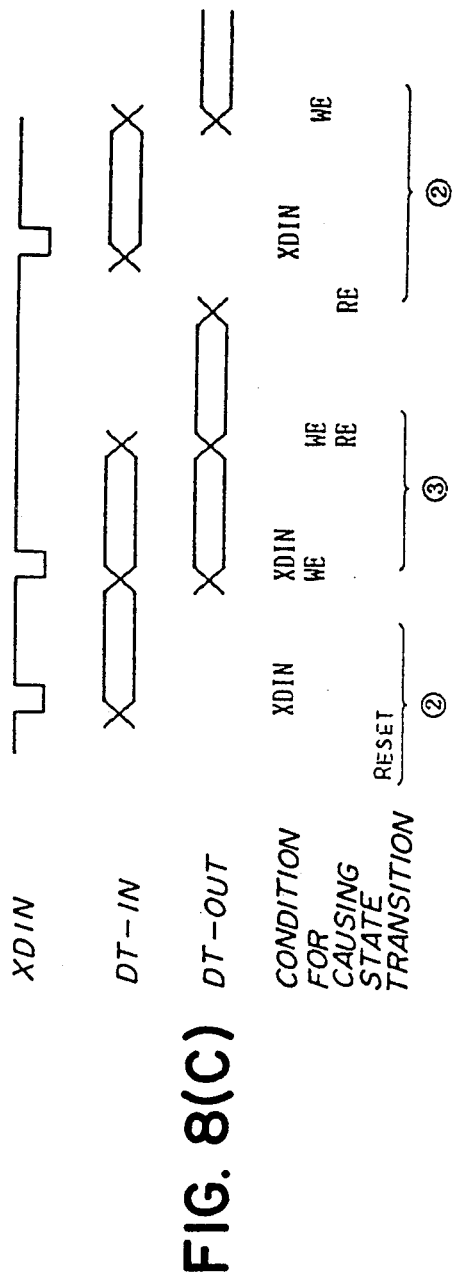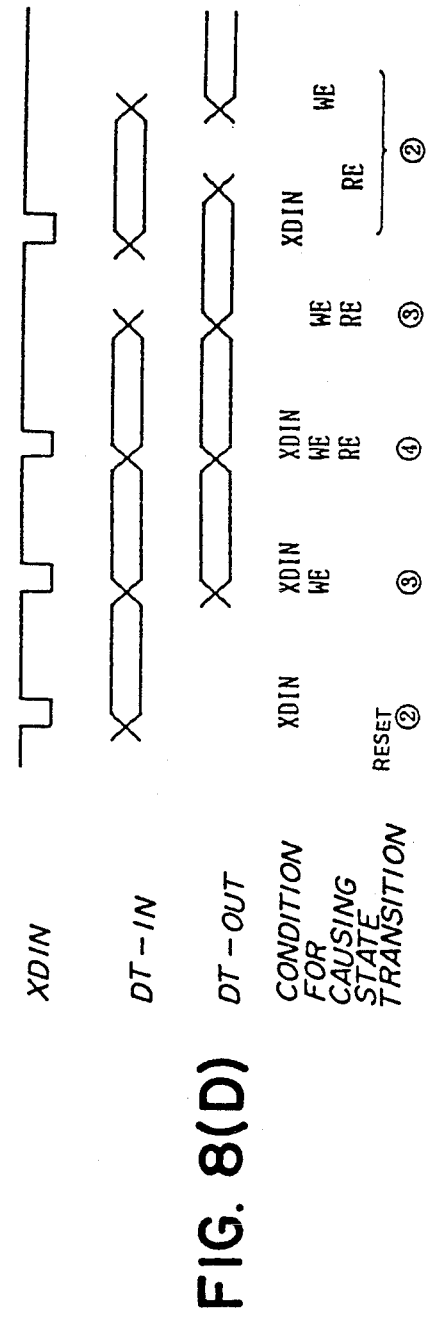

SCAN CONVERTER CONTROL CIRCUIT HAVING MEMORIES AND ADDRESS GENERATOR FOR GENERATING ZIGZAG ADDRESS SIGNAL SUPPLIED TO THE MEMORIES

BACKGROUND OF THE INVENTION

The present invention generally relates to a scan converter control circuit having memories, and more particularly to a circuit for controlling a scan converter directed to reducing the bit rate of an image signal. Further, the present invention is concerned with an address generator which generates a zigzag address supplied to memories of the scan converter.

As is well known, an image signal has a wide frequency range. In order to transmit such an image signal in digital form, it is necessary to reduce the bit rate of the image signal. For this requirement, a bandwidth compression coding is proposed which utilizes the correlation between the spatial axis and the time axis.

The power of an image signal concentrates on the low frequency components thereof. From this point of view, the bandwidth of the image signal is compressed by an orthogonal transform coding in which the image data is converted into frequency components. Examples of the orthogonal transform coding are a discrete cosine transform (DCT) coding, Hadamard transform (H) coding and Fourier transform (FT) coding.

In the discrete cosine transform, output data Y is obtained by the formula, $Y = CXC^t$, where X is input data, C is a predetermined square matrix based on the transform type and $C^t$ is the transposed matrix of the square matrix C. In order to realize the above-mentioned formula by using hardware, the following procedures are required. Matrix data ($8 \times 8$ pixel data) must be rearranged on the input and output sides of an operation unit. Matrix data which is transferred in synchronism with a data input clock must be input to the operation unit in synchronism with an operation clock. Matrix data which is output from the operation unit in synchronism with the operation clock must be output in synchronism with a data output clock.

Referring to FIG. 1, there is illustrated a DCT coding circuit which implements the above-mentioned procedures required to realize the aforementioned formula by hardware. Input data applied to the DCT coding circuit is sent to an operation unit 82 via a scan converter 81. The operation unit 82 executes a predetermined operation procedure using coefficient data read out from a memory 83. The calculation results output by the operation unit 82 are sent to an external circuit of the next stage via a scan converter 84.

Each of the scan converters 81 and 84 has two memory planes (areas) and a controller (software). The controller alternatively switches the two memory planes and controls read and write addresses supplied to the two memory planes.

FIG. 2 is a diagram illustrating a memory plane switching operation, a write operation and a read operation. One of the two memory planes is input to 64 pixel data DT-IN in synchronism with a data input signal XDIN (FIG. 2(A)). The 64 data DT-IN are written into the memory plane in a writing order shown in FIG. 2(B), that is, a receiving sequence in a vertical scan. After the 64 data DT-IN are completely written into the memory plane, the 64 data DT-IN are read out from the plane in a read order shown in FIG. 2(C), that is, an output order in a zigzag scan. The readout data are indicated by DT-OUT in FIG. 2(A). On the other hand, 64 data are input to the other memory plane in synchronism with the next data input signal XDIN. Then, the write and read operations are carried out in the same way as described above. With the above-mentioned arrangement, it becomes possible to rearrange successive input data.

The procedure for alternately writing input data into the two memory planes of each of the scan converters 81 and 84 is alternately switched in accordance with the data input signal XDIN. The procedure for reading out data from the memory planes is carried out subsequently after the writing of input data is completed. In this manner, the memory plane switching procedure is independently carried out for each of the two memory planes. Conventionally, the memory plane switching procedure is realized by software (program). In this case, a huge number of steps are necessary to implement the memory plane switching procedure. Thus, it is very difficult to execute the memory plane switching procedure in real time. As a result, it is very difficult to process consecutive image data in real time.

SUMMARY OF THE INVENTION

It is a general object of the present invention to provide an improved scan converter control circuit in which the above-mentioned disadvantages are eliminated.

A more specific object of the present invention is to provide a scan converter control circuit in which control of the scan converter is implemented by hardware so that image data can be handled at higher-speed in real time.

The above-mentioned objects of the present invention are achieved by a scan converter control circuit comprising:

first and second memories, each having a data write mode and a data read mode which are selected in response to a switching signal so that the first memory is in the data write mode when the second memory is in the data read mode and the first memory is in the data read mode when the second memory is in the data write mode;

write address counter means, operatively coupled to the first and second memories, for generating a write address which is to be alternately supplied to the first and second memories and for generating a write completion signal when the write address becomes equal to a predetermined count value;

read address counter means, operatively coupled to the first and second memories, for generating a read address which is to be alternately supplied to the first and second memories and for generating a read completion signal when the read address becomes equal to a predetermined count value;

data input control means, operatively coupled to the write address counter means, for enabling the write address counter means in response to a data input signal supplied from an external circuit and for disabling the write address counter means when receiving the write completion signal;

memory switching control means, operatively coupled to the first and second memories, for generating the switching signal having a logic value which is changed in response to the write completion signal; and data output control means, operatively coupled to the write address counter means, the read address counter means and the first and second memories, for enabling the read address counter means in response to the write completion signal and for disabling the read address counter means in response to the read completion signal.

The aforementioned objects of the present invention are also achieved by a scan converter control circuit in which the aforementioned write address counter means or read address counter means comprises:

first up/down counter means, having an up count mode and a down count mode selectively specified by a first instruction signal, for generating an X address in an X direction of an n×n pixel block by counting a clock signal and for generating a first underflow signal when the X address becomes equal to zero in the down count mode;

second up/down counter means, having an up count mode and a down count mode selectively specified by a second instruction signal, for generating a Y address in a Y direction of the n×n pixel block by counting the clock signal and for generating a second underflow signal when the Y address becomes equal to zero in the down count mode;

first comparator means, operatively coupled to the first up/down counter means, for comparing the X address with (n−1) and for generating a first coincidence detection signal when the X address becomes equal to (n−1);

second comparator means, operatively coupled to the second up/down counter means, for comparing the Y address with (n−1) and for generating a second coincidence detection signal when the Y address becomes equal to (n−1); and control means, coupled to the first and second up/down counter means and the first and second comparator means, for initially loading an initial value into the first and second up/down counter means, setting one of the first and second up/down counter means to the down count mode and setting the other one of the first and second up/down counter means to the up count mode and for disabling one of the first and second up/down counter means during a next clock period of the clock signal when the one of the first and second up/down counter means generates a corresponding one of the first and second underflow signals and simultaneously interchanging modes of the first and second up/down counter means.

BRIEF DESCRIPTION OF THE DRAWINGS

Other objects, features and advantages of the present invention will become apparent from the following detailed description when read in conjunction with the accompanying drawings, in which:

FIGS. 2(A)-(C) are diagrams illustrating a conventional memory plane switching operation, write operation and read operation, respectively, all of which are executed in the DCT coding circuit shown in FIG. 1;

FIGS. 8(A)-(C) are timing diagrams of operation of the scan converter shown in FIG. 4 which corresponds to the state transitions shown in FIG. 7;

DESCRIPTION OF THE PREFERRED EMBODIMENTS

A description will now be given of a scan converter control circuit according to a preferred embodiment of the present invention.

Figure 3:
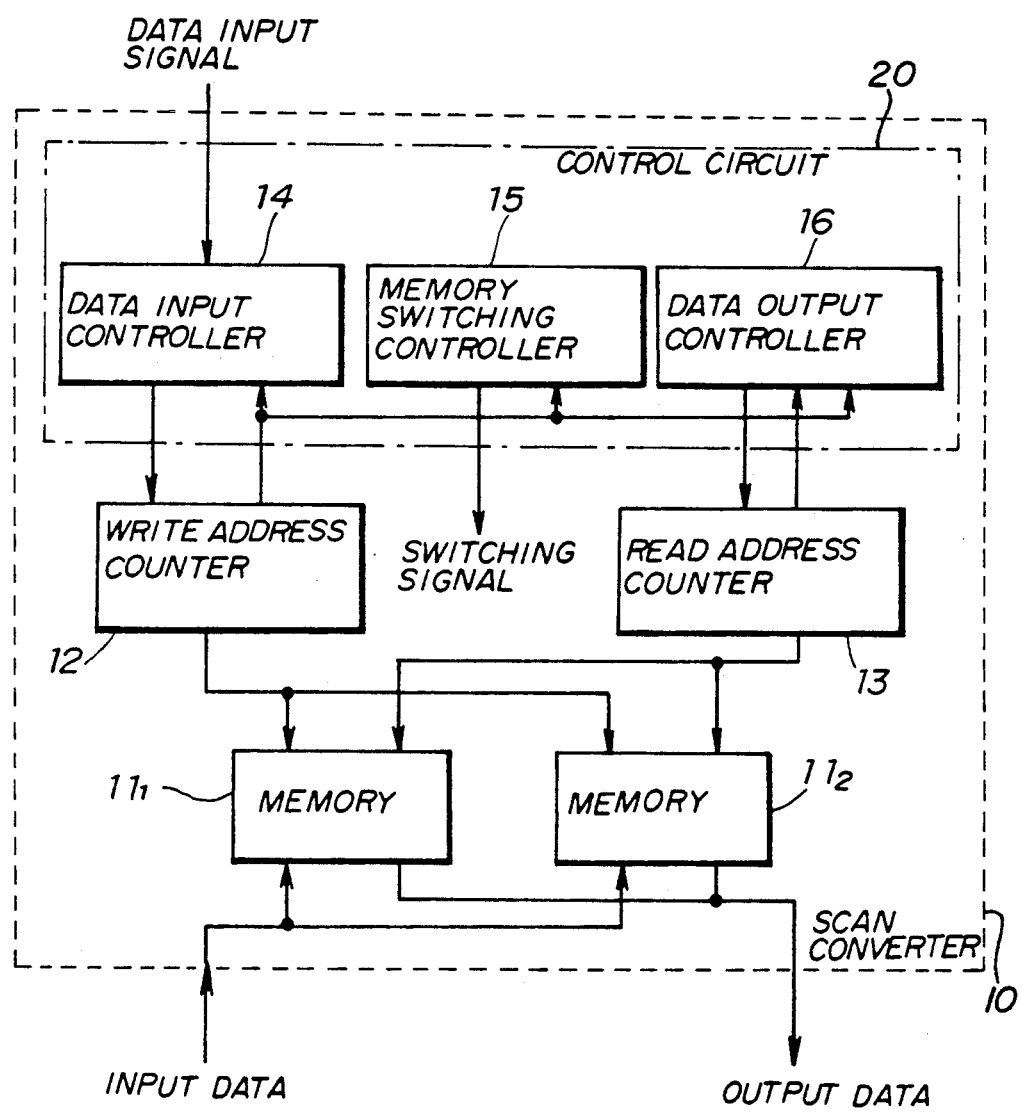
FIG. 3 is a block diagram of a scan converter according to a preferred embodiment of the present invention.

FIG. 3 is a block diagram of the general structure of a scan converter control circuit according to the preferred embodiment of the present invention. A scan converter 10 has a control circuit 20. A plurality of memories (two memories in the structure shown in FIG. 3) $11_1$ and $11_2$ are alternately set to a write mode and a read mode in accordance with a switching signal generated and output by a memory switching controller 15 provided in the control circuit 20. For example, when the memory $11_1$ is in the write mode, the memory $11_2$ is in the read mode. A write address counter 12 generates a write address and outputs a write completion signal when the counter value becomes equal to a predetermined count value. A read address counter 13 generates a read address, and outputs a read completion signal when the counter value becomes equal to a predetermined count value. A data input controller 14 in the control circuit 20 starts the counting operation of the write address counter 12 in response to a data input signal which request to input data, and stops the counting operation thereof in response to the write completion signal. The memory switching controller 15 inverts the logical value of the switching signal in response to the write completion signal so that the memory plane switching operation for the memories $11_1$ and $11_2$ is realized. A data output controller 16 of the control circuit 20 starts the counting operation of the read address counter 13 in response to the write completion signal, and stops the counting operation thereof in response to the read completion signal.

In response to the data input signal, the data input controller 14 starts the counting operation of the write address counter 12. The write address counter 12 outputs the write address to either the memory $11_1$ or $11_2$ which is selected by the switching signal generated and output by the memory switching controller 15. Then, input data is written into the selected memory $11_1$ or $11_2$.

In response to the write completion signal output by the write address counter 12, the data input controller 14 stops the counting operation of the write address counter 12. The memory switching controller 15 inverts the logical value of the switching signal so that the memory planes of the memories $11_1$ and $11_2$ are switched. The data output controller 16 starts the counting operation of the read address counter 13 in response to the write completion signal. The read address counter 13 supplies the read address to the memory in which the input data is stored in response to the switching signal generated and output by the memory switching controller 15. Then output data is read out from the selected memory $11_1$ or $11_2$. The data output controller 16 stops the counting operation of the read address counter 13 in response to the read completion signal. With the above-mentioned hardware-oriented arrangement, it becomes possible to execute the memory plane switching procedure of the memories $11_1$ and $11_2$ based on the status transition of the scan converter 10 in accordance with the data input signal, the write completion signal and the read completion signal.

Figure 4:
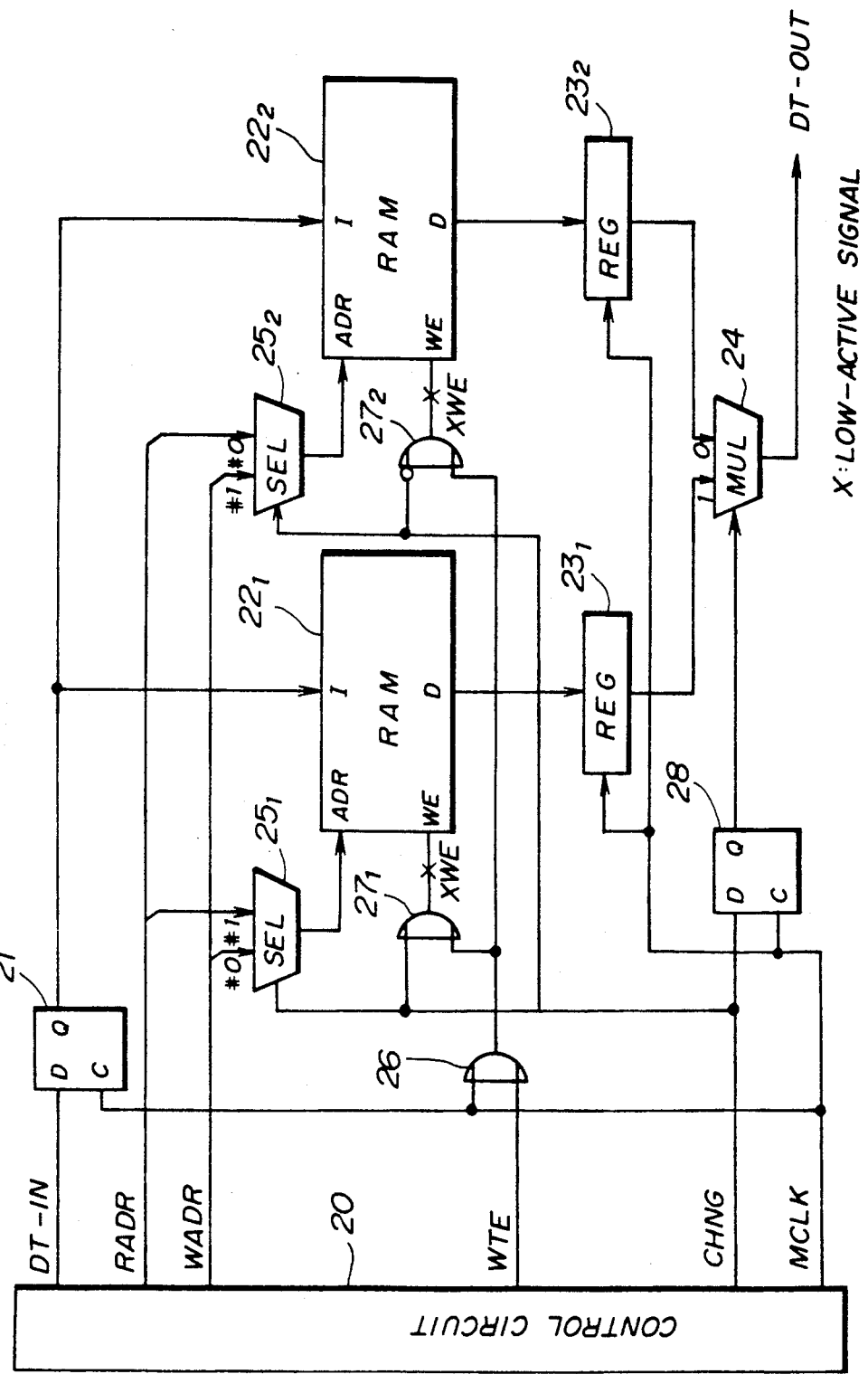
FIG. 4 is a circuit diagram of the structure shown in FIG. 3.

FIG. 4 is a circuit diagram of the scan converter 10 shown in FIG. 3. The scan converter 10 shown in FIG. 4 is composed of the control circuit 20 and its peripheral circuits, which will be described in detail below.

Input data DT-IN output by the control circuit 20 is input to data input terminals I of RAMs $22_1$ and $22_2$ via a D-type flip-flop 21. Output terminals of the RAMs $22_1$ and $22_2$ are connected to a multiplexer (MUL) 24 via registers (REG) $23_1$ and $23_2$, respectively. Output data DT-OUT is output from the output terminal of the multiplexer 24. A switching signal CHNG for the RAMs $22_1$ and $22_2$ is sent to selectors (SEL) $25_1$ and $25_2$ from the control circuit 20. Each of the selectors $25_1$ and $25_2$ has two input terminals, and selects one of the two input terminals on the basis of the logical values "0" and "1" of the switching signal CHNG. One of the two input terminals of each of the selectors $25_1$ and $25_2$ is supplied with a write address WADR, and the other input terminal is supplied with a read address RADR. That is, the input terminal labeled #0 of the selector $25_1$ is supplied with the write address WADR, and the other input terminal labeled #1 thereof is supplied with the read address RADR. The write address WADR is supplied to the input terminal labeled #1 of the selector $25_2$, and the read address RADR is supplied to the input terminal labeled #0 thereof.

A low-active write enable control signal WTE generated and output by the control circuit 20 is input to a write enable terminal WE of the RAM $22_1$ via OR gates 26 and $27_1$. The OR gate 26 is also supplied with a clock signal MCLK generated and output by the control circuit 20. The OR gate $27_1$ is also supplied with the switching signal CHNG generated and output by the control circuit 20. The write enable control signal WTE is also input to a write enable terminal WE of the RAM $22_2$ via the OR gate 26 and further an OR gate $27_2$. The OR gate $27_2$ is also supplied to the inverted version of the logical value of the switching signal CHNG. It can be seen from the above description that the write enable control signal WTE from the OR gate 26 is supplied as a write enable signal XWE, to one of the RAMs $22_1$ and $22_2$ in accordance with the switching signal CHNG. The switching signal CHNG is applied to the multiplexer 24 via a D-type flip-flop 28, and selects one of the two inputs, that is, output data read out from the RAMs $22_1$ and $22_2$ in accordance with the logical value of the switching signal CHNG. The clock signal MCLK is supplied to the D-type flip-flops 21 and 28, and the registers $23_1$ and $23_2$.

Figure 5:
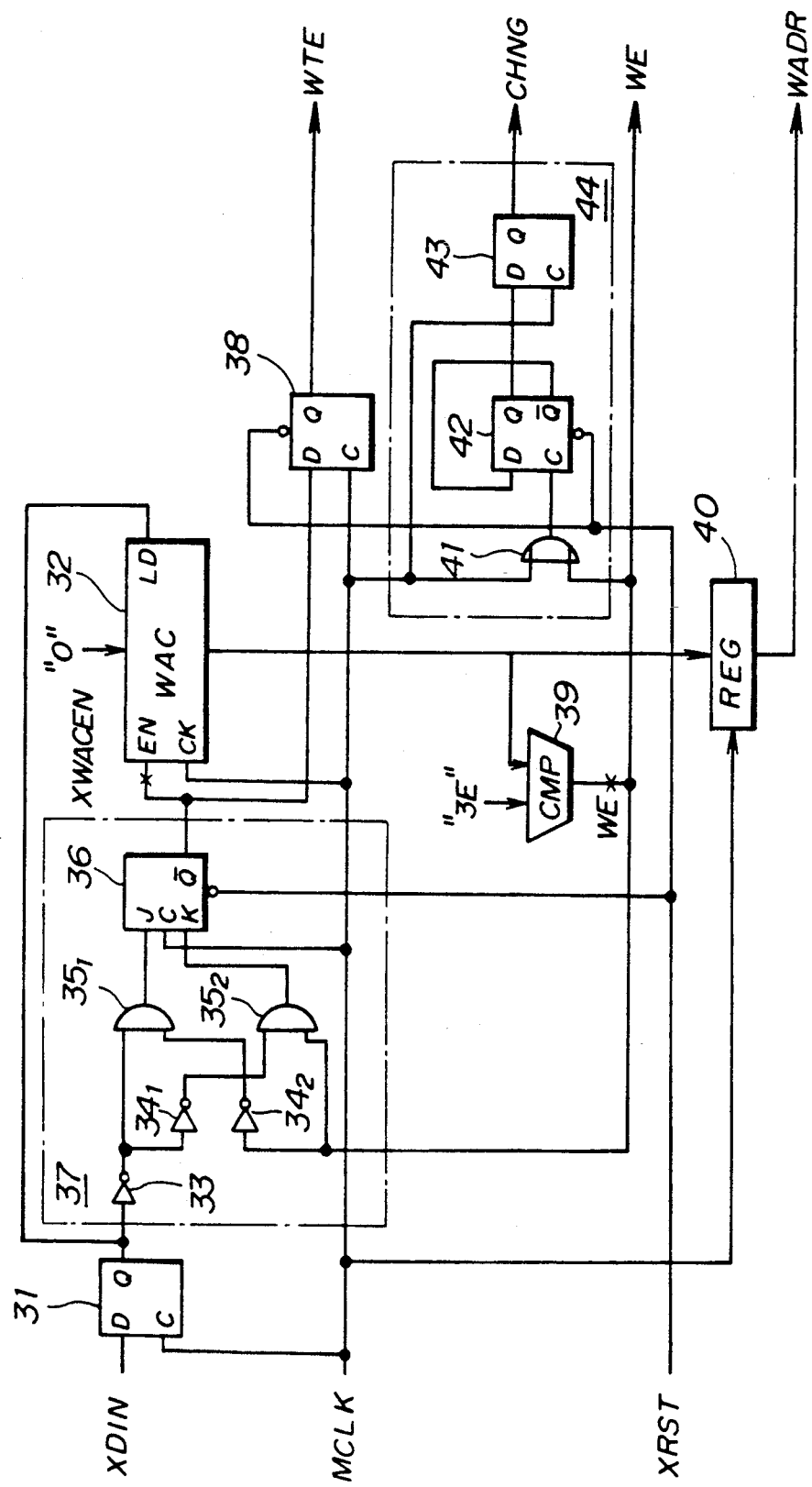
FIG. 5 is a circuit diagram of a data input controller and a memory switching controller shown in FIG. 3.
Figure 6:
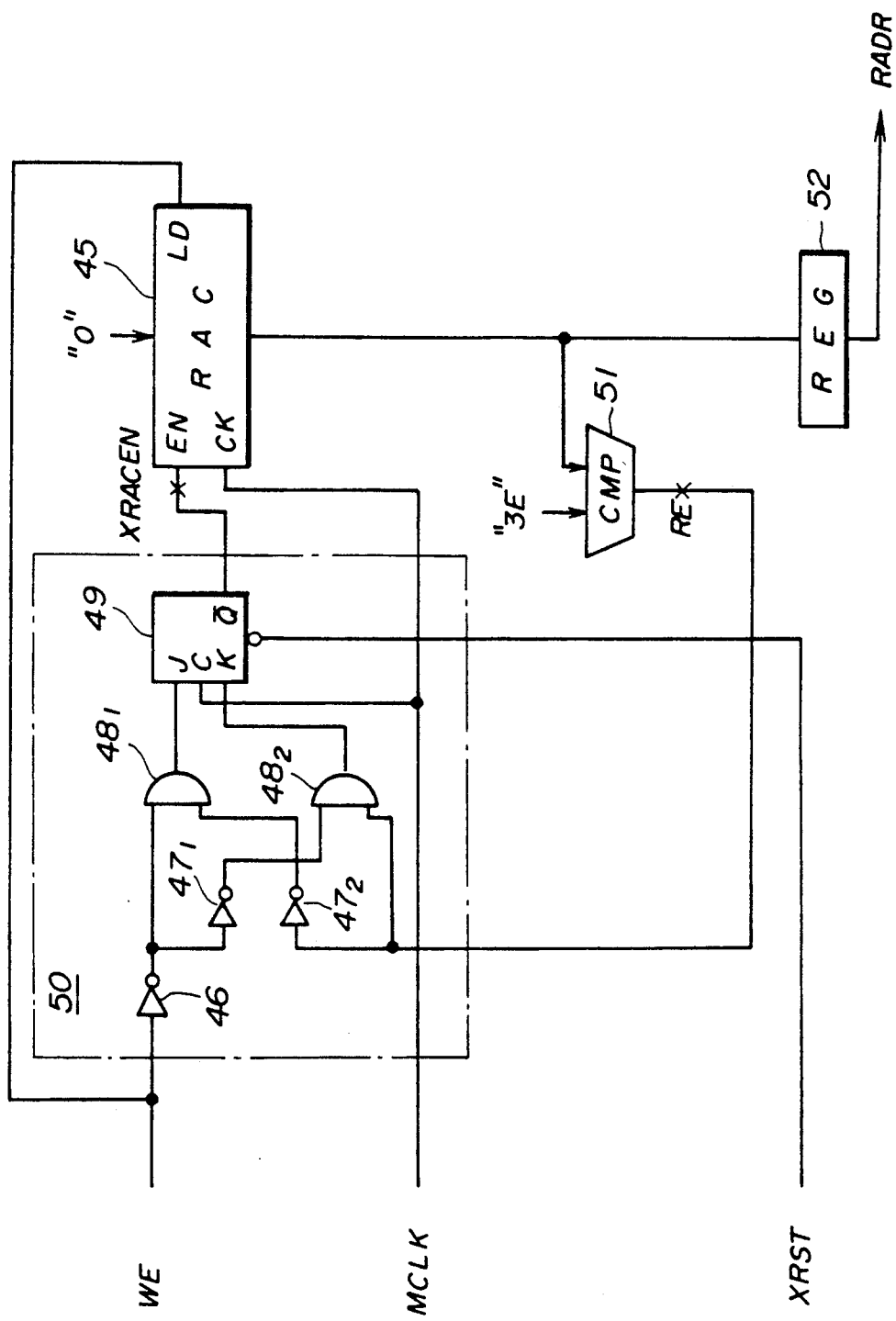
FIG. 6 is a circuit diagram of a data output controller shown in FIG. 3.

FIGS. 5 and 6 are circuit diagrams of the control circuit 20 shown in FIGS. 3 and 4. The circuit shown in FIG. 5 corresponds to the data input controller 14 and the memory switching controller 15 shown in FIG. 3. The circuit shown in FIG. 6 corresponds to the data output controller 16 shown in FIG. 3.

Referring to FIG. 5, the data input signal XDIN is input to a load terminal LD of a write address counter (WAC) 32 via a D-type flip-flop 31 and to a write address counter controller 37. As shown in FIG. 5, the write address counter controller 37 is composed of inverters 33, $34_1$ and $34_2$, AND gates $35_1$ and $35_2$ and a JK-type flip-flop 36. A low-active write address count enable signal XWACEN generated and output by the write address counter controller 37 is input to a count enable terminal EN of the write address counter 32 and is also output, as the aforementioned write enable control signal WTE, via a D-type flip-flop 38. A plurality of parallel input terminals of the write address counter 32 are all fixed to a low level, and a plurality of parallel output terminals thereof are connected to one of the two input terminals of a comparator 39, and also connected to the selectors $25_1$ and $25_2$ (FIG. 4) via a register 40. That is, the aforementioned write address WADR is drawn from the register 40. The other input terminal of the comparator 39 is fixedly supplied with a bit pattern which corresponds to a count value (=3E in hexadecimal notification) used for detecting the completion of the counting operation of the write address counter 32. The comparator 39 outputs the write completion signal WE, which is sent to a memory switching controller 44 and to the other input terminal of the write address counter controller 37.

A logic circuit composed of the inverters 33, $34_1$ and $34_2$ and the AND gates $35_1$ and $35_2$ of the write address counter controller 37 generates two output signals. Both of the output signals are set to a high level when both the data input signal XDIN and the write completion signal WE are at a logically low level. The two output signals of the above-mentioned logic circuit are input to J and K input terminals of the flip-flop 36. The write address count enable signal XWACEN is drawn from the inverted terminal $\bar{Q}$ of the flip-flop 36.

The input terminal of the memory switching controller 44 connected to the comparator 39 is connected to an OR gate 41 of the memory switching controller 44. The OR gate 41 is also supplied with the clock signal MCLK. The output terminal of the OR gate 41 is connected to a clock terminal C of a D-type flip-flop 42 of the memory switching controller 44. The output terminal Q of the flip-flop 42 is output, as the aforementioned switching signal CHNG, via a D-type flip-flop 43 of the memory switching controller 44.

The clock signal MCLK is supplied to the write address counter 32, the D-type flip-flops 31, 38 and 43, and the JK-type flip-flop 36. A reset signal XRST is supplied to a reset terminal of the JK-type flip-flop 36 and a preset terminal of the D-type flip-flop 38.

Referring to FIG. 6, the write completion signal WE is applied to a load terminal LD of a read address counter (RAC) 45 and a read address counter controller 50. As shown in FIG. 6, the read address counter controller 50 is composed of inverters 46, $47_1$ and $47_2$, AND gates $48_1$ and $48_2$ and a JK-type flip-flop 49. A read address count enable signal XRACEN generated and output by the read address counter controller 50 is applied to a count enable terminal EN of the read address counter 45. A plurality of parallel input terminals of the read address counter 45 are all fixed to a low level, and a plurality of parallel output bits thereof are supplied to one of the two input terminals of a comparator 51. The parallel output bits of the read address counter 45 are also supplied, as read address RADR, to the selectors $25_1$ and $25_2$ (FIG. 4) via a register 52. The other input terminal of the comparator 51 is fixed to a bit pattern corresponding to a count value (=3E) for detecting the completion of the counting operation. The output signal of the comparator 51 is the aforementioned read completion signal RE, which is supplied to the other input terminal of the read address counter controller 50.

The read address counter controller 50 has a logic circuit which is composed of the inverters 46, $47_1$ and $47_2$ and AND gates $48_1$ and $48_2$ and which generates two output signals. When both the write completion signal WE and the read completion signal RE are at the low level, one of the two output signals from the logic circuit is at the high level. On the other hand, when both the write completion signal WE and the read completion signal RE are at the high level, the other output signal from the logic circuit is at the high level. The two output signals of the logic circuit are applied to the input terminals J and K of the flip-flop 49. The aforementioned read address count enable signal XRACEN which is to be applied to the enable terminal EN of the read address counter 45 is drawn from the inverted output $\bar{Q}$ of the flip-flop 49.

The clock signal MCLK is supplied to the read address counter 45, the JK-type flip-flop 49 and the register 52, and the reset signal XRST is applied to a reset terminal of the flip-flop 49.

The scan converter 10 having the above-mentioned arrangement generates the data input signal XDIN, the write completion signal WE, the read completion signal RE and control signals based on the status of the scan converter at timings when the signals XDIN, WE and RE are applied, so that the memory plane switching procedure is independently carried out for each of the memories $11_1$ and $11_2$. The control signals control the RAMs $22_1$ and $22_2$, the write address counter 32 and the read address counter 45.

Figure 7:
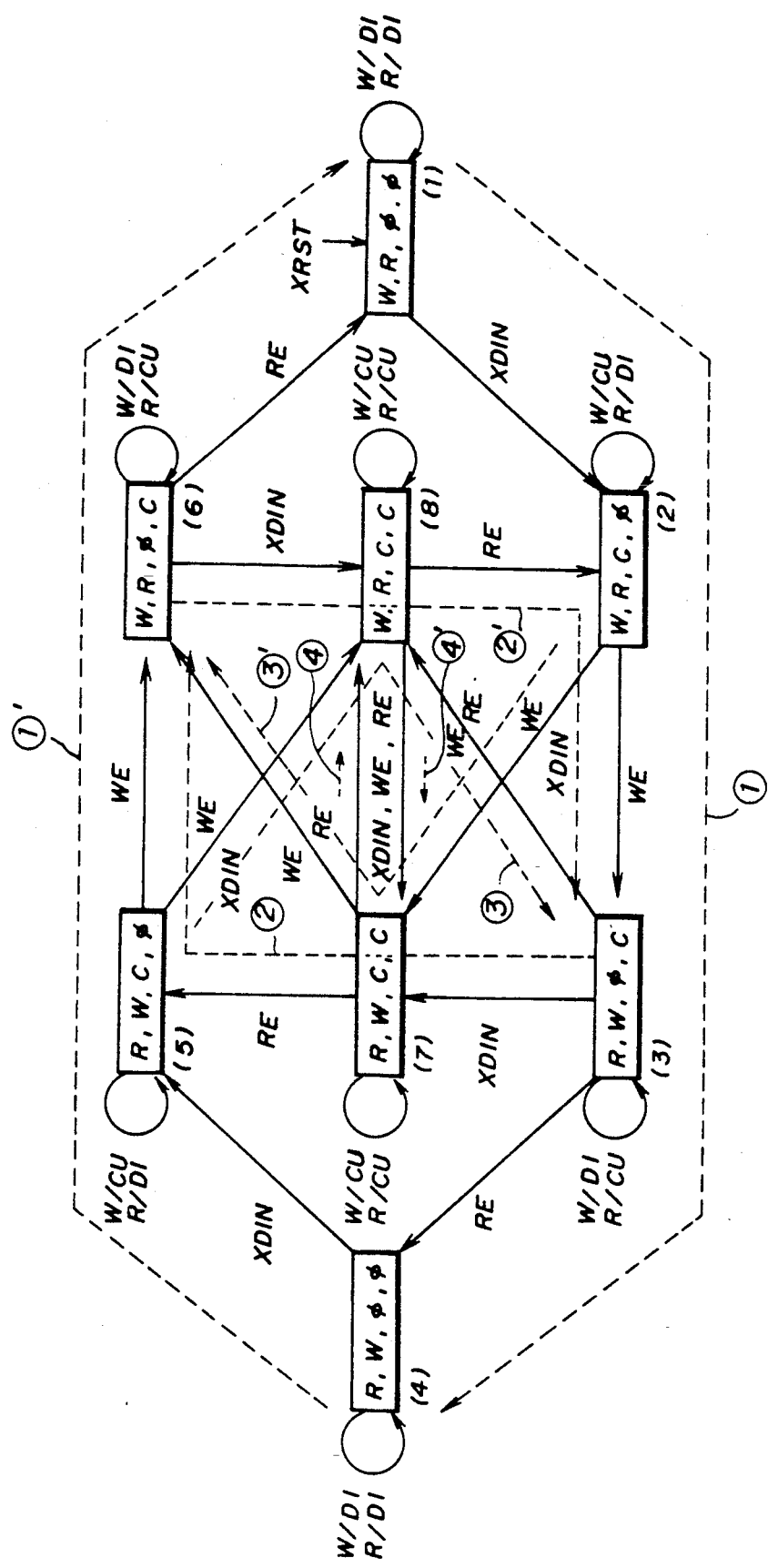
FIG. 7 is a diagram of possible state transitions which occur in the scan converter according to the preferred embodiment of the present invention.

FIG. 7 is a diagram illustrating the state transition of the scan converter 10. Possible state transitions (1)-(8) of the scan converter 10 take place in the directions shown by the arrows in FIG. 7. Each of the states is defined by four parameters of the operation mode of the RAM $22_1$, the operation mode of the RAM $22_2$, the state of the write address counter 32 and the state of the read address counter 45. Capital letters "W" and "R" shown in FIG. 7 are related to the RAMs $22_1$ and $22_2$. Capital letter "W" denotes the data write mode of the RAM $22_1$ or $22_2$ being considered, and capital letter "R" denotes the data read mode of the RAM $22_1$ or $22_2$ being considered. Capital letter "C" and reference "$\phi$" shown in FIG. 7 are related to the write address counter 32 and the read address counter 45. Capital letter "C" denotes that the write address counter 32 or the read address counter 45 being considered is executing the counting operation, and "$\phi$" denotes that the write address counter 32 or the read address counter 45 is in the stop mode or denotes that all the bits are set at zero.

Symbol "W/" denotes that the state of the write address counter 32 obtained after transition is the same as the immediately previous state (which is specified by capital letters attached to this symbol, such as CU or DI). Symbol "R/" denotes that the state of the read address counter 45 obtained after transition is the same as the immediately previous state (which is specified by the capital letters attached to this symbol, such as CU or DI). "CU" denotes a state where the count up operation is possible, and "DI" denotes a state where the count up operation is inhibited (disabled). Symbols ("WE", "RE" and "XDIN") attached to the arrows shown in FIG. 7 indicate a condition where a corresponding transition has occurred. A transition with two or more symbols attached thereto takes place when the conditions designated by these symbols are simultaneously satisfied. ①-④ and ①'-④' indicate the flows of transition indicated by dotted lines.

Figure 8A:
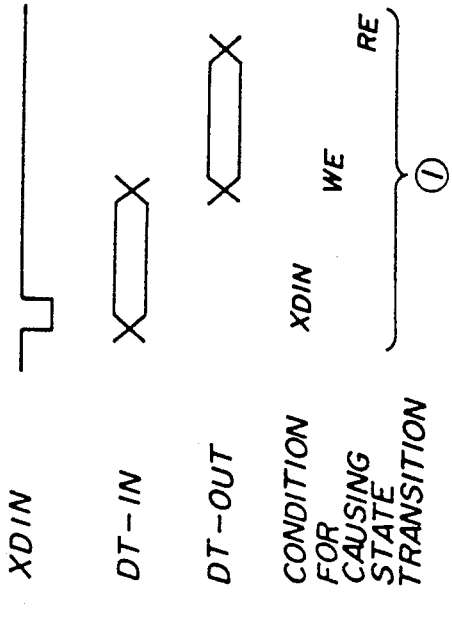

FIG. 8 illustrates the operation of the scan converter 10 which corresponds to the state transition shown in FIG. 7. As shown in FIG. 8(A), reference ① in FIG. 7 indicates a state transition where input data DT-IN is input in response to the data input signal XDIN and is completely read out in the state where the data input signal data writing and reading operations are not carried out.

The control circuit 20 performs the control of state transition ① as follows. In response to the reset signal XRST, the memory switching controller 44 outputs the low-level switching signal XCHNG. Thus, the RAMs $22_1$ and $22_2$ are respectively selected as the data input (write) memory and data output (read) memory by the selectors $25_1$ and $25_2$, the OR gates $27_1$ and $27_2$ and the multiplexer 24 ((1) in FIG. 7).

When the data input signal XDIN in this state is received, the write address counter controller 37 outputs the low-level write address count enable signal XWACEN. The write address counter 32 outputs all zeros by the data input signal XDIN applied to the load terminal LD thereof, and then starts to output the write address WADR in synchronism with the clock signal MCLK. The D-type flip-flop 38 outputs the low-level write enable control signal WTE, which is applied to the RAM $22_1$ via the OR gate $27_1$. Thus, input data DT-IN is successively written into the RAM $22_1$ ((2) in FIG. 7).

The comparator 39 outputs the write completion signal WE when the output of the write address counter 32 becomes equal to 3E in hexadecimal notation. In response to the write completion signal WE, the write address counter controller 37 restores the write address count enable signal WACEN to the high level. Thus, after the write address counter 32 counts the last count value, it stops the count operation. The memory switching controller 44 inverts the logic value of the switching signal CHNG in response to the write completion signal WE, and selects the RAM $22_2$ which will be used for the next writing operation. The output of the RAM $22_1$ becomes connected to the output terminal of the scan converter 20 via the multiplexer 24 ((3) in FIG. 7).

On the other hand, the read address counter controller 50 outputs the low-level read address count enable signal XRACEN in response to the write completion signal WE. In response to the low-level read address count enable signal XRACEN, all the bits of the read address counter 45 are reset. Then, the read address counter 45 starts to output the read address RADR in synchronism with the clock signal MCLK. The read address signal RADR is supplied to the RAM $22_1$ via the selector $25_1$ by the switching signal CHNG. Data read out from the RAM $22_1$ is output via the multiplexer 24. The comparator 51 outputs the read completion signal RE when the count value in the read address counter 45 becomes equal to 3E in hexadecimal notation. In response to the read completion signal RE, the read address counter controller 50 restores the read address count enable signal RACEN to the high level. As a result, after counting the last count value, the read address counter 45 stops the counting operation ((4) in FIG. 7).

Figure 8B:
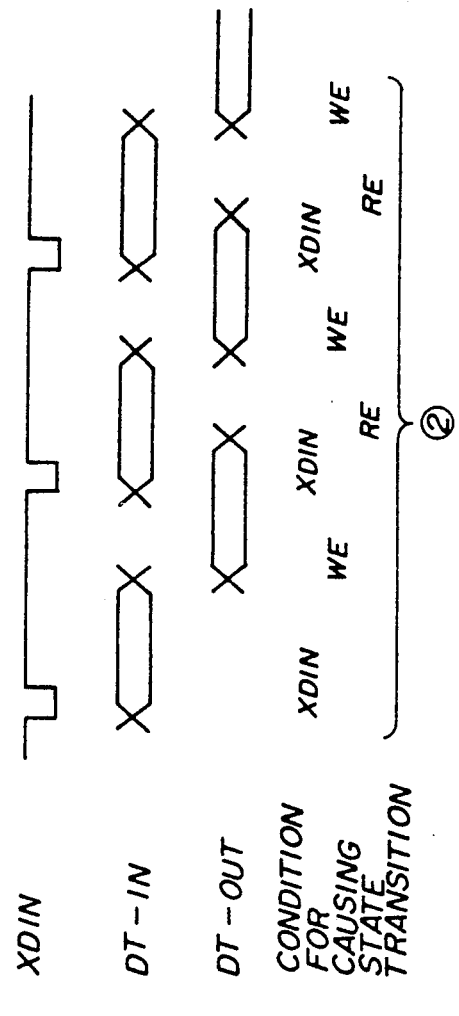

As shown in FIG. 8(B), reference ② in FIG. 7 shows a state transition where the next data input signal XDIN is applied while the data is being output. The control circuit 20 carries out the control of state transition ② as follows.

When the data input signal XDIN is applied in the state ((3) in FIG. 7) obtained before the operation of writing input data into the RAM $22_2$ while data is being read out from the RAM $22_1$, the write address counter 32 outputs the write address WADR under the control of the write address counter controller 37. The D-type flip-flop 38 outputs the low-level write enable control signal WTE, and the RAM $22_2$ is supplied with the write enable signal XWE via the OR gate $27_2$. Thus, the input data DT-IN is successively written into the RAM $22_2$ in parallel with the data output operation of the RAM $22_1$ ((7) in FIG. 7).

When the count value of the read address counter 45 becomes equal to 3E in hexadecimal notation, the comparator 51 outputs the read completion signal RE. In response to the read completion signal RE, the read address counter 45 stops the counting operation under the control of the read address counter controller 50 ((5) in FIG. 7).

When the count value in the write address counter 32 becomes equal to 3E in hexadecimal notation, the comparator 39 outputs the write completion signal WE. The write address counter 32 stops the counting operation in response to the write completion signal WE. The memory switching controller 44 inverts the switching signal CHNG in response to the write completion signal WE, so that the RAM $22_1$ is selected. The RAM $22_1$ will be used in the next writing operation. The output of the RAM $22_2$ is coupled to the output terminal of the scan converter 10 via the multiplexer 24 ((6) in FIG. 7).

As shown in FIG. 8(C), reference ③ indicates the flow of state transition in a case where the next data input signal XDIN is applied at the same time as the completion of inputting data of the unit block. The control circuit 20 controls the state transition ③ as follows.

In the state where data written into the RAM $22_1$ has already been read out therefrom and data is written into the RAM $22_2$ ((5) in FIG. 7), the write address counter controller 37 maintains the write address count enable signal WACEN at the low level and the write address counter 32 continues to output the write address WADR, when the write complete signal WE and the data input signal XDIN are supplied at the same time. The D-type flip-flop 38 outputs the write enable control signal WTE maintained at the low level, and the RAM $22_1$ is supplied with the write enable signal XWE. Thus, input data DT-IN is written into the RAM $22_1$ in parallel with the data output operation of the RAM $22_2$. In response to the write completion signal WE, the read address counter 45 outputs the read address RADR under the control of the read address counter controller 50. The read address RADR is supplied to the RAM $22_2$ designated by the switching signal CHNG. Data read out from the RAM $22_2$ is output via the multiplexer 24 ((8) in FIG. 7).

Subsequently, when the read completion signal RE and the write completion signal WE are supplied at the same time, the write address counter controller 37 restores the write address count enable signal WACEN to the high level. Thereby, the write address counter 32 stops the counting operation. The read address counter controller 50 maintains the read address count enable signal RACEN at the low level, and thus the read address counter 32 continues to count the read address. The memory switching controller 44 inverts the switching signal CHNG in response to the write completion signal WE. The RAM $22_2$ is selected as the memory used in the next writing operation, and the output of the RAM $22_1$ is coupled to the scan converter 10 via the multiplexer 24 ((3) in FIG. 7).

As shown in FIG. 8(D), reference ④ in FIG. 7 indicates the flow of state transition in a case where the next data input signal XDIN is supplied at the time when the data input operation and the data output operation are completed at the same time. The control circuit 20 controls the state transition ④ as follows.

When the data input signal XDIN, the write completion signal WE and the read completion signal RE are supplied at the same time, the write address counter controller 37 and the read address counter controller 50 maintain the write address count enable signal WACEN and the read address count enable signal RACEN at the low level, respectively. The memory switching controller 44 inverts the switching signal CHNG in response to the write completion signal WE. Thus, the data read operation and the data write operation are carried out in parallel by alternately using the RAMs $22_1$ and $22_2$ ((7), (8) in FIG. 7).

It will be noted that ①'-④' are the same as ①-④ except that the memory planes used in ①'-④' are different from those used in ①-④.

Figure 9:
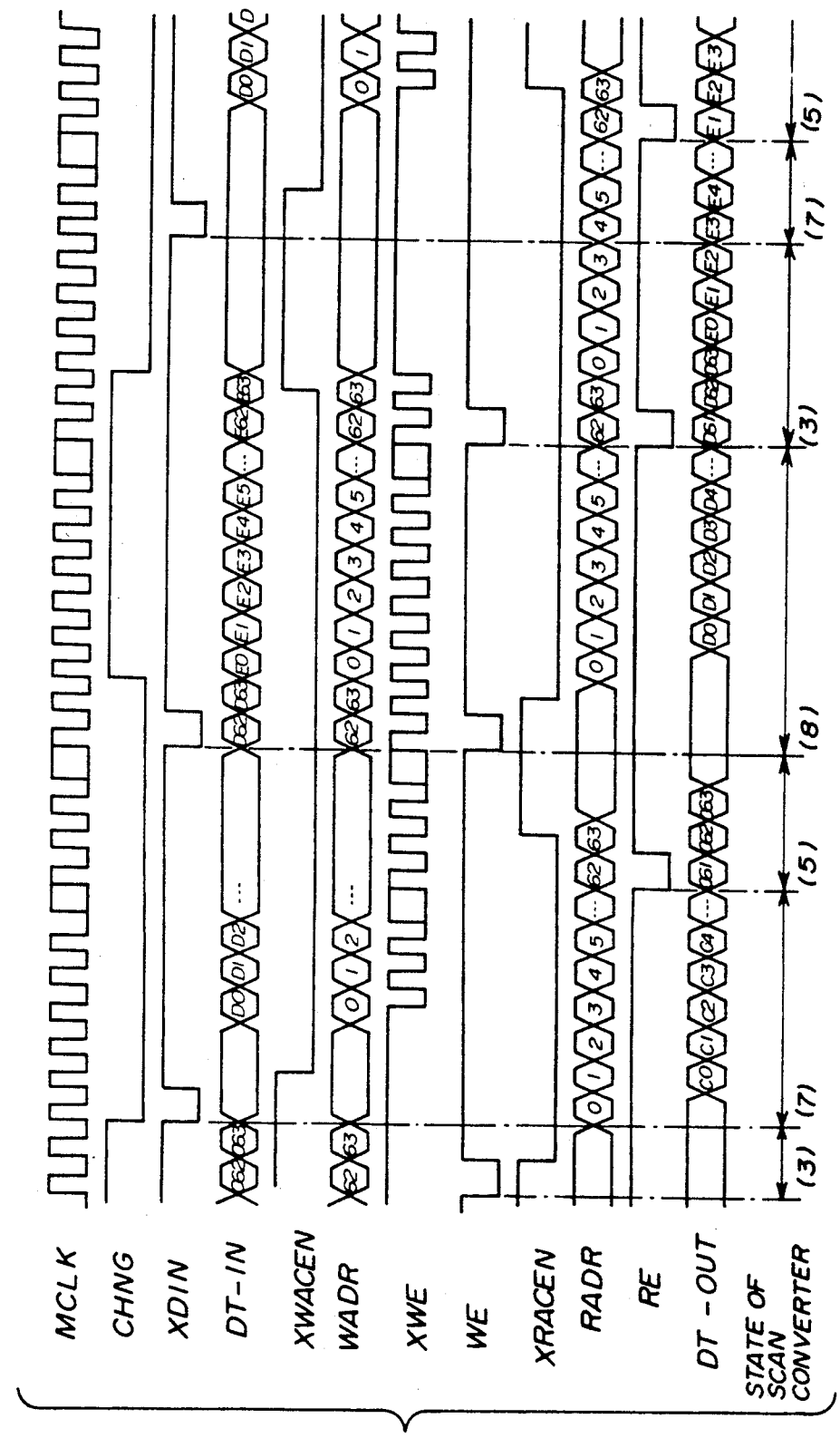
FIG. 9 is a timing diagram of the operation of the scan converter shown in FIG. 4.

FIG. 9 is a timing diagram of the operation of the above-mentioned embodiment of the present invention. The states of the scan converter 10 (3), (5), (7) and (8) in FIG. 9 correspond to the states (3), (5), (7) and (8) shown in FIG. 7, respectively. It can be seen from FIG. 9 and the aforementioned description that it is possible to independently switch the two memory planes used for data writing and reading by means of special hardware and thus handle image data at higher speeds in real time.

Alternatively, it is possible to operate the write address counter 32 and the read address counter 45 at different clock signals so that output data is read out at a bit rate different from that of input data.

Figure 10A:
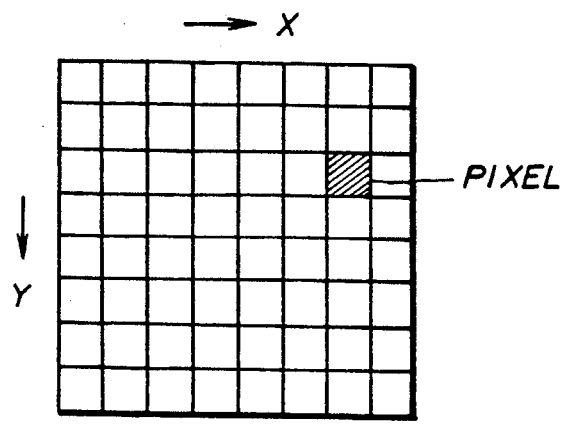
FIGS. 10A, 10B and 10C are diagrams illustrating a zigzag scan.
Figure 10B:
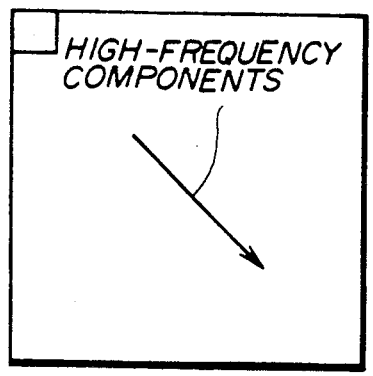
Figure 10C:
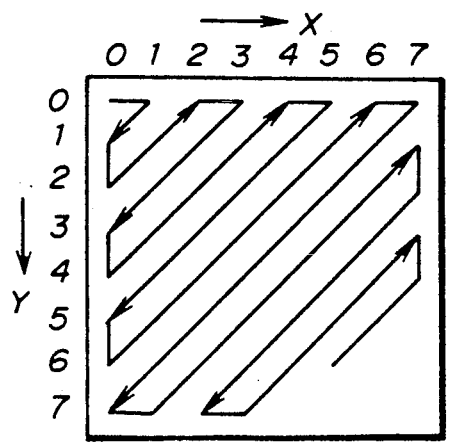

A description will now be given of the zigzag address signal generated by the write address counter 32 (FIG. 5) or the read address counter 45 (FIG. 6). To begin with, the zigzag addressing will be described with reference with FIGS. 10A, 10B and 10C. FIG. 10A illustrates an 8×8 pixel block consisting of 64 bits. As shown in FIG. 10B, the 64 pixel data are subjected to the DCT conversion procedure in which they are discretely grouped into frequency components. A D.C. component of the frequency components appears at a left upper portion of the pixel block. Much power of image data concentrates at low-frequency components. High-frequency components gradually appear toward a right lower portion of the pixel block. In order to successively output the frequency components from the low-frequency side to the high-frequency side, it is required to scan the pixel block in zigzag form starting from the left upper portion thereof (D.C. component), as shown in FIG. 10C. The write address counter 32 (FIG. 5) or the read address counter 45 generates the zigzag address which realizes the zigzag addressing shown in FIG. 10C.

Figure 11:
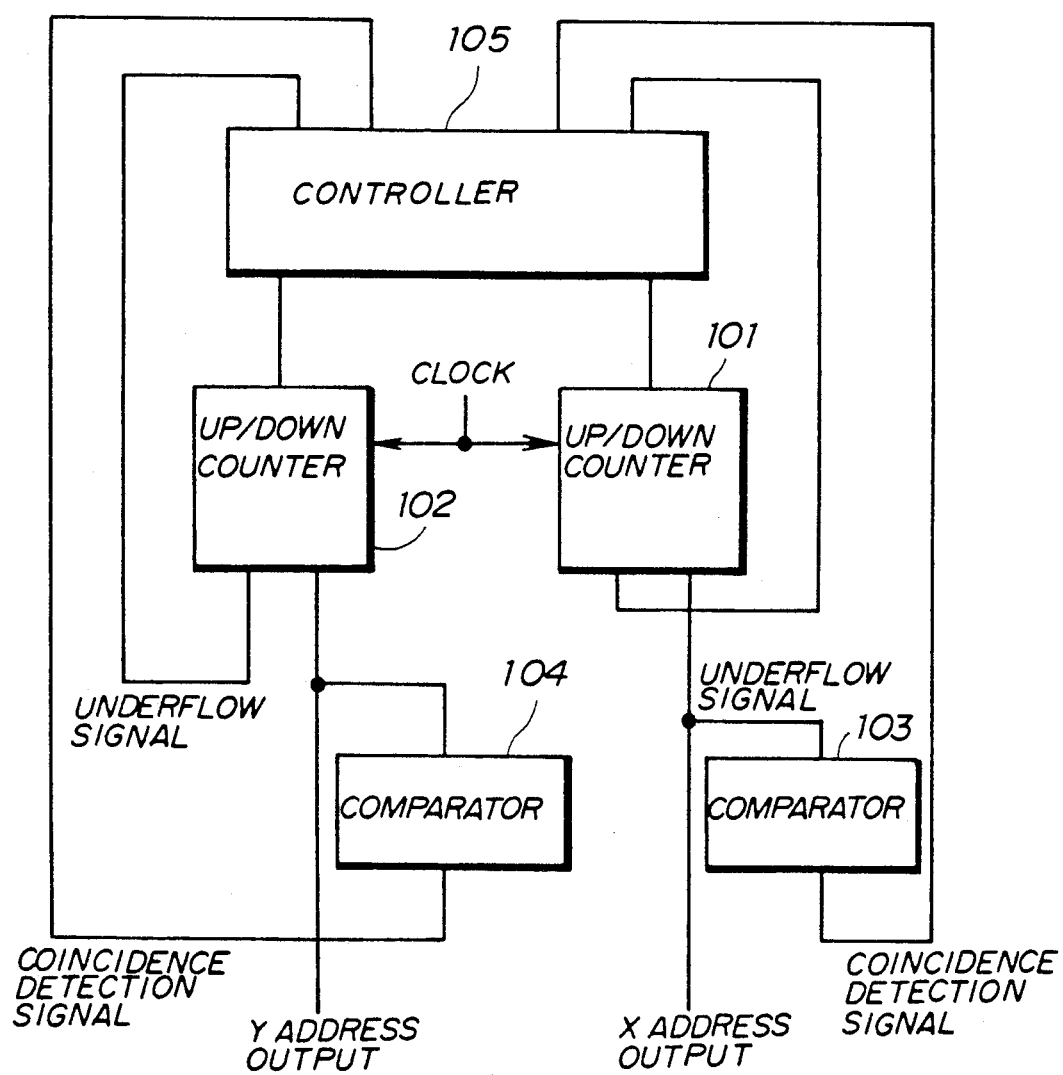
FIG. 11 is a block diagram of a counter used in the scan converter.

FIG. 11 is a block diagram of a counter which serves as the write address counter 32 or the read address counter 45. Referring to FIG. 11, the counter which generates a zigzag address for an n×n block (n is an arbitrary integer) is composed of up/down counters 101 and 102, comparators 103 and 104 and a controller 105. The up/down counters 101 and 102 count up or down a clock in accordance with an instruction, and output an X address and a Y address, respectively. When each of the up/down counters 101 and 102 has a count value of zero and is instructed to count down the clock, it outputs an underflow signal. The comparators 103 and 104 output a coincidence detection signal when an output address value thereof is compared with (n−1) and both are identical to each other. Initially, the controller 5 loads zero into the up/down counters 101 and 102, and sets one of the up/down counters 101 and 102 to an up count mode and sets the other counter to a down count mode. When receiving the underflow signal from one of the up/down counters 101 and 102, the controller 105 stops the counting operation of this counter during a next clock cycle, and interchanges the modes of the up/down counters. After one of the up/down counters 101 and 102 counts n, the modes of the up/down counters 101 and 102 are interchanged during the next period after one of the up/down counters 101 and 102 outputs the coincidence detection signal. Further, during a next clock cycle, the up/down counter being considered is stopped by the controller 105. When both the up/down counters 101 and 102 respectively count n, the address generating operation is ended.

As indicated above, initially, the controller 105 loads a count value of 0 in the up/down counters 101 and 102. Then, the controller 105 sets one of the up/down counters 101 and 102 to the up count mode and the other counter to the down count mode. Thereby, the pixel tracing in an oblique direction is realized. In this case, when one of the up/down counters 101 and 102 outputs the underflow signal, that is, when X or Y becomes zero during down counting in the X or Y direction, the counter being considered stops the counting operation during the next clock period. Thus, X or Y is incremented by +1 in the state where the X or Y is maintained at zero. At the same time, the modes of the up/down counters 101 and 102 are interchanged. Thereby, the pixel tracing in an opposite oblique direction is started. The tracing in the oblique directions is repeatedly carried out.

After one of the up/down counters 101 and 102 counts the maximum value n, that is, after the tracing point reaches a right upper portion or a left lower portion of the data block shown in FIG. 10A, when one of the comparators 103 and 104 outputs the coincidence detection signal, the modes of the up/down counters 101 and 102 are interchanged and the counting operation of the counter which outputs the coincidence detection signal is stopped. Thus, X or Y is incremented by +1 while the other X or Y is maintained at n. Then, the pixel tracing is started in the opposite oblique direction. The above-mentioned operation is repeatedly carried out. When the count values of both the up/down counters 101 and 102 become equal to n, the counting operations of the up/down counters 101 and 102 are stopped so that the generation of a sequence of addresses is ended.

Figure 12:
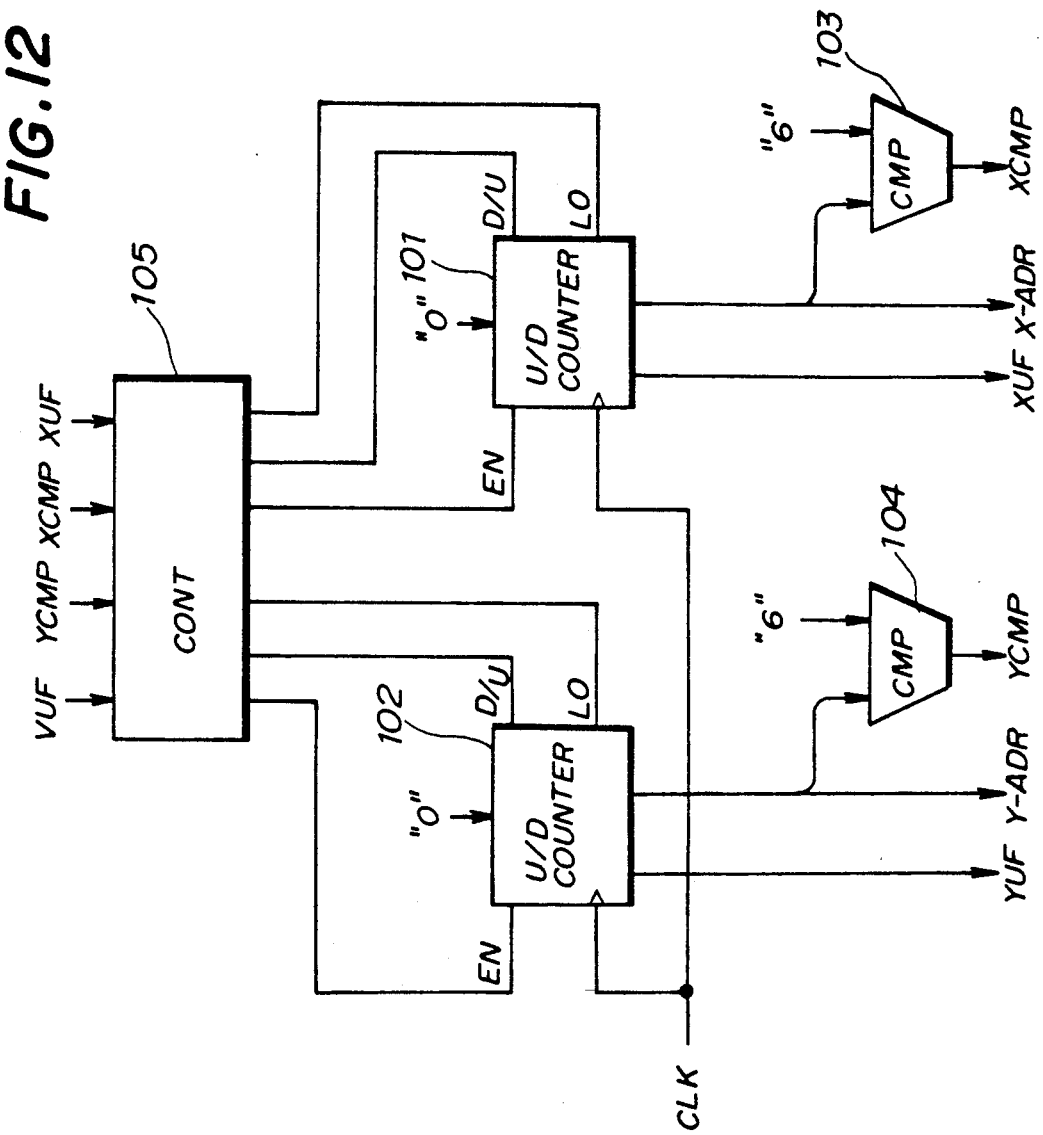
FIG. 12 is a block diagram of a detailed configuration of the counter shown in FIG. 11.

FIG. 12 is a block diagram of a more detailed structure of the counter shown in FIG. 11, in which those parts which are the same as those shown in FIG. 11 are given the same reference numerals. The up/down counter 101 generates an X address X-ADR, and the up/down counter 102 generates a Y address Y-ADR. The up/down counters 101 and 102 operate in accordance with control signals which are supplied thereto. The control signals are an enable signal EN, a switching signal D/U and a load signal LO. On the output sides of the up/down counters 101 and 102, there are provided the comparators 103 and 104, respectively. The controller 105 receives signals YUF, YCMP, XCMP and XUF and controls the up/down counters 101 and 102.

Figure 13:
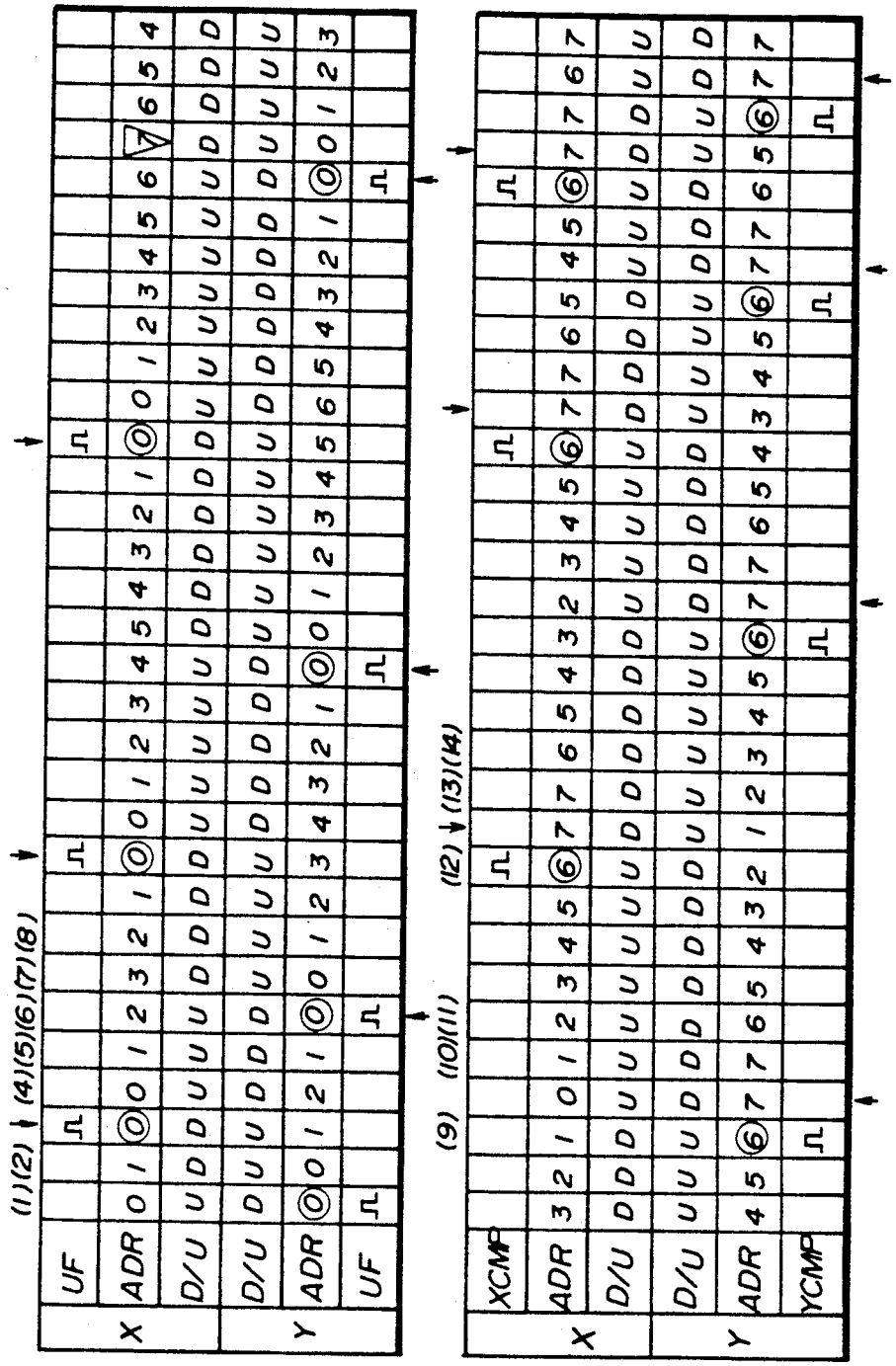
FIG. 13 is a diagram illustrating the operation of the counter shown in FIG. 12.

FIG. 13 is a timing diagram of the operation of the counter shown in FIG. 12, in which the 8×8 pixel block is processed. The counter shown in FIG. 12 generates the zigzag address as follows.

The zigzag address is generated so that the addresses (ADR) in the X and Y directions change sequentially from the left upper point (0, 0) in accordance with a clock CLK (FIG. 12). Each arrow shown in FIG. 13 denotes that the supply of the enable signal EN is stopped during one clock period. (1)–(14) shown in FIG. 13 correspond to the following operations (1)–(14).

During operation (1), the controller 105 sends the load signals LO to the up/down counters 101 and 102 so that each of the up/down counters 101 and 102 outputs an address (0, 0). During this operation, the controller 105 sets the switching signal D/U concerned with the X direction (which is supplied to the up/down counter 101) to the up count mode, and sets the switching signal D/U concerned with the Y direction (which is supplied to the up/down counter 102) to the down count mode. Thereby, the underflow signal YUF in the Y direction is generated by the up/down counter 102 related to the Y direction. That is, each of the up/down counters 101 and 102 generates the underflow signal when the down count mode is instructed in the state where the count value is zero.

During operation (2), the X address is incremented by 1 in synchronism with the next clock CLK, and on the other hand, the up/down counter 102 is in a disable state due to the fact that the underflow signal is generated at the previous clock timing so that the Y address is maintained at zero. As a result, during operation (2), address (1, 0) is generated. At this time, the controller 105 switches the switching signal D/U related to the X direction to the down count mode (D) in response to the underflow signal UF which is generated with respect to the Y direction during the previous clock period, and switches the switching signal D/U related to the Y direction to the up count mode (U).

During operation (3), the X address is changed to 0 in synchronism with the next clock CLK, and the Y address is changed to 1 in synchronism therewith. As a result, address (0, 1) is generated. During this operation, the switching signal D/U related to the X direction is maintained in the down count mode. Thus, the underflow signal UF is generated by the up/down counter 101. The switching signal D/U related to the Y direction is maintained in the up count mode.

During operation (4), in response to the next clock signal CLK, the supply of the write enable signal EN addressed to the up/down counter 101 related to the X direction is stopped. On the other hand, the Y address is incremented by 1 so that it becomes equal to 2. As a result, address (0, 2) is generated. During this operation, the switching signal D/U related to the X direction is switched to the up count mode since the underflow signal is generated by the up/down counter 101 during the previous clock period. The switching signal D/U in the Y direction is switched to the down count mode.

During operation (5), the X address is incremented by 1 and changed to 1, and the Y address is changed to 1. Thus, address (1, 1) is generated. During this operation, the switching signal D/U related to the X direction is maintained in the up count mode, and the switching signal related to the Y direction is maintained in the down count mode.

During operation (6), the X address is incremented by 1 in synchronism with the clock signal CLK, so that the X address becomes equal to 2. On the other hand, the Y address becomes equal to zero. Thus, address (2, 0) is generated. During this operation, the switching signal D/U related to the X direction is maintained in the up count mode, and the switching signal D/U related to the Y direction is maintained in the down count mode. Thus, the underflow signal UF is generated by the up/down counter 102.

During operation (7), the X address is incremented by 1 in response to the clock signal CLK, so that the X address becomes equal to 3. On the other hand, the supply of the enable signal EN related to the Y direction is stopped, and thus the underflow signal UF is generated by the up/down counter 102. As a result of this operation, address (3, 0) is generated. During this operation, the controller 5 switches the operation mode of the switching signal D/U related to the X direction from the up count mode to the down count mode. On the other hand, the mode of the switching signal D/U related to the Y direction is switched to the up count mode.

During operation (8), the X address becomes equal to 2 and the Y address becomes equal to 1 in response to the next clock signal CLK, so that address (2, 1) is generated. During this operation, the switching signal D/U related to the X direction is maintained in the down count mode, and the switching signal D/U related to the Y direction is maintained in the up count mode.

In the same way, each time the X address or the Y address becomes equal to 0, the underflow signal UF is generated and the modes of the up/down counters 101 and 102 are interchanged. When the address becomes equal to (0, 7), the controller 105 controls the up/down counters 101 and 102 by a different procedure as follows.

During operation (9), each of the comparators 3 and 4 compares each X address and Y address with "6". When each X address and Y address individually coincide with "6" in the up count mode, the comparators 103 and 104 generate control signals XCMP and YCMP, respectively. The control signals XCMP and YCMP become effective after the X address becomes equal to "7" at first, as indicated by a triangle symbol in FIG. 13.

The switching signal D/U related to the X direction indicates the down count mode up to address (1, 6), and the switching signal D/U related to the Y direction indicates the up count mode up to (1, 6). When the address becomes identical to (0, 7) in synchronism with the clock CLK due to the occurrence of the control signal YCMP, the switching signal D/U related to the X direction is switched to the up count mode, and the switching signal D/U related to the Y direction is switched to the down count mode. At the same time, the controller 7 activates a built-in flip-flop (not shown in FIG. 12) and delays the control signal YCMP by one cycle. After that at the timing indicated by the arrow, the supply of the enable signal EN addressed to the up/down counter 102 is stopped so that it is in the disabled state. Thereby, the value in the Y direction is maintained at 7.

During operation (10), the X address becomes equal to 1 in response to the next clock CLK, and on the other hand, the Y address is maintained at 7. As a result, address (1, 7) is generated. During this operation, the switching signal D/U related to the X direction is maintained in the down count mode, and the switching signal D/U related to the Y direction is maintained in the up count mode.

During operation (11), the X address becomes equal to 2 and the Y address becomes equal to 6 in response to the next clock CLK. Thus, address (2, 6) is generated. During this operation, the switching signal D/U related to the X direction is maintained in the up count mode, and the switching signal D/U related to the Y direction is maintained in the down count mode.

During operation (12), the address become identical to (6, 2) and the comparator 103 generates the control signal XCMP. When the address becomes identical to (7, 1) in response to the next clock CLK, the switching signal D/U related to the X direction is changed to the down count mode, and the switching signal D/U related to the Y direction is changed to the up count mode. At the same time, the built-in flip-flop operates and the value in the X address is maintained at 7.

During operation (13), the X address related to the X direction is maintained at 7 in response to the next clock CLK, and on the other hand, the Y address is changed to 2. Thus, address (7, 2) is generated. During this operation, the switching signal D/U related to the X direction is maintained in the down count mode, and the switching signal D/U related to the Y direction is maintained in the up count mode.

In the above-mentioned way, each time the X address or the Y address becomes equal to 6 in the up count mode, the control signal XCMP or YCMP is generated and the modes of the up/down counters 101 and 102 are interchanged, so that the zigzag address is generated. When the tracing point, that is, the current address becomes coincident to (7, 7) at the right lower point, the address generating procedure is terminated. Then, the up/down counters 101 and 102 return to the initial state when the load signal LO is generated by the controller 105.

Figure 14:
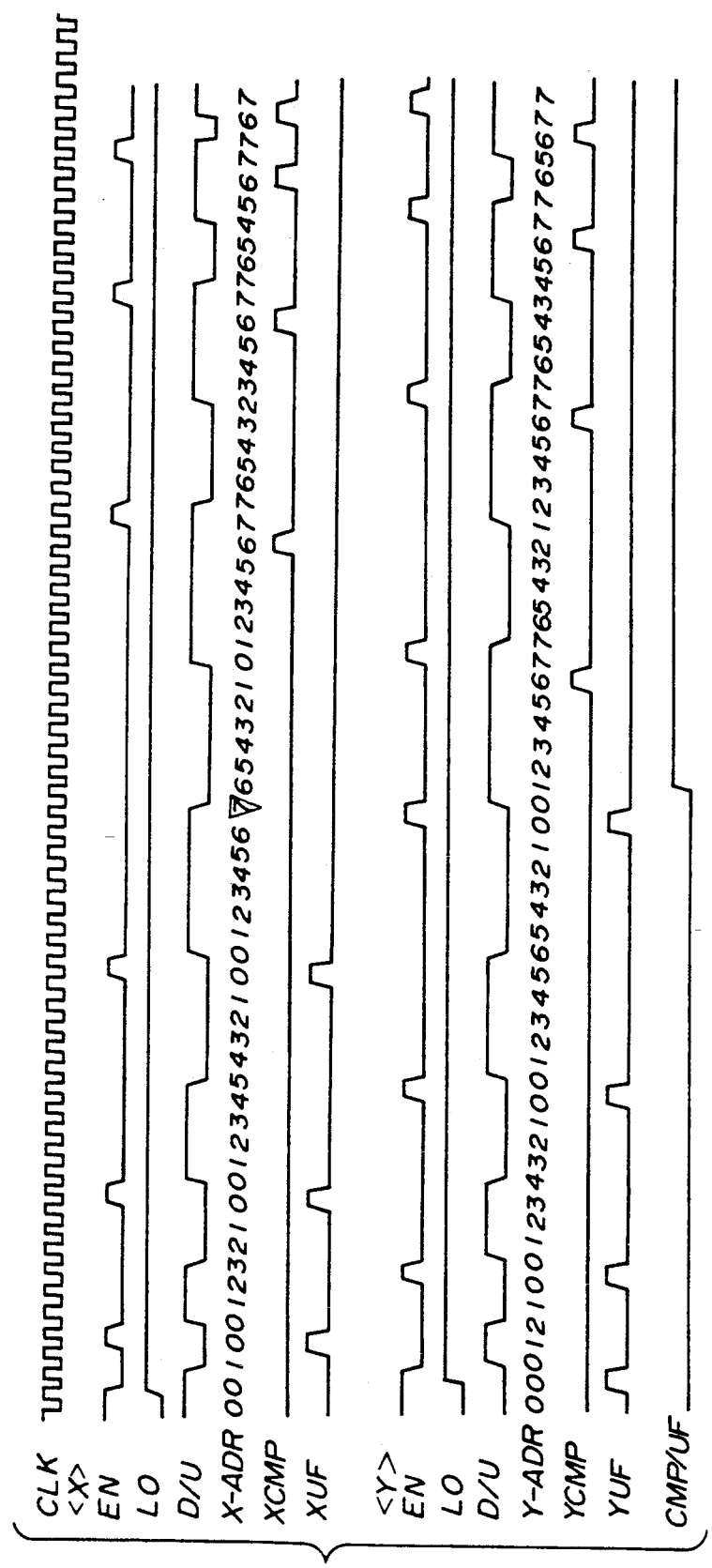
FIG. 14 is a timing diagram of the operation of the counter shown in FIG. 12.

FIG. 14 is a timing chart illustrating the operation of the counter shown in FIG. 12. In FIG. 14, signals below (X) are related to the X direction, and signals below (Y) are related to the Y direction. It will be seen that the timing chart conforms with the aforementioned operation of the counter shown in FIG. 12.

Figure 15:
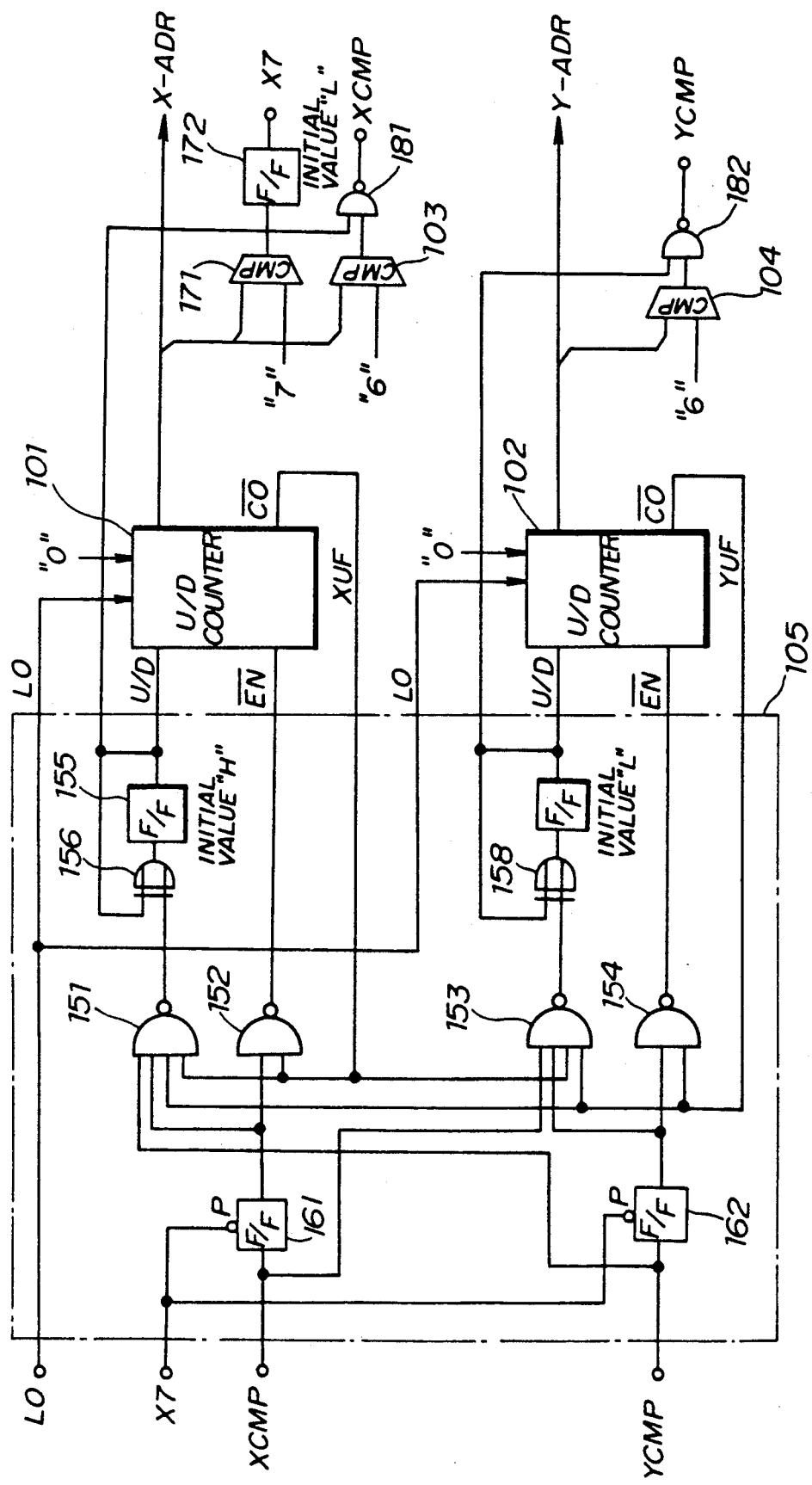
FIG. 15 is a circuit diagram of a controller shown in FIG. 12.

FIG. 15 is a circuit diagram of the counter shown in FIG. 12. The controller 105 is composed of flip-flops 151, 157, 161 and 162, NAND gates 151, 152, 153 and 154 and exclusive-OR gates 156 and 158. The X address X7 (X=7) generated by a latch circuit 172 is supplied, as a timing signal, to the flip-flops 161 and 162. The control signal XCMP output by a NAND gate 181 is input to the flip-flop 161 and the NAND gate 153. The control signal YCMP generated by a NAND gate 182 is input to the flip-flop 162 and the NAND gate 151. The output terminal of the flip-flop 161 is connected to the NAND gates 151 and 152. The output terminal of the flip-flop 162 is connected to the NAND gates 153 and 154. The underflow signal XUF output by the up/down counter 101 is input to the NAND gates 151, 152 and 153. The underflow signal YUF output by the up/down counter 102 is input to the NAND gates 151, 153 and 154. The output terminal of the NAND gate 151 is connected to the exclusive-OR gate 156, which is also connected to the output terminal of the flip-flop 155. The output terminal of the NAND gate 152 is connected to the enable terminal $\overline{EN}$ of the up/down counter 101. The output terminal of the NAND gate 153 is connected to the exclusive-OR gate 158, which is also connected to the output terminal of the flip-flop 157. The output terminal of the NAND gate 154 is connected to the enable terminal $\overline{EN}$ of the up/down counter 102. The flip-flops 155 and 157 output the write enable signals $\overline{EN}$ to switching signal terminals of the up/down counters 101 and 102, respectively.

The load signal LO supplied from an external circuit (not shown) passes through the controller 105 and is then input to the up/down counters 101 and 102. The X address X-ADR output by the up/down counter 101 is input to comparators 171 and 103, which are also supplied with "7" and "6", respectively. The output terminal of the comparator 171 is connected to a latch circuit 172, which outputs X7. The output of the comparator 103 is connected to the NAND gate 181, which is also supplied with the switching signal U/D output by the flip-flop 155. The control signal XCMP is drawn from the output terminal of the NAND circuit 181. The Y address Y-ADR is input to the comparator 104, which is also supplied with "6". The output of the comparator 104 is connected to a NAND gate 182, which is also supplied with the switching signal U/D output from the flip-flop 157. The NAND gate 182 outputs the control signal YCMP.

Initially, the flip-flops 155 and 157 are set to "H (high)" and "L (low)", respectively, and the latch circuit 172 is set to "L". The flip-flops 161 and 162 are preset because the output of the latch circuit 172 is at "L". The up/down counter 101 is initially set to the up count mode since the flip-flop 155 is set to "H". On the other hand, the up/down counter 102 is initially set to the down count mode since the flip-flop 157 is set to "L". The flip-flops 161 and 162 are provided for delaying, by a time corresponding to one clock, the signal X7 generated when the up/down counter 101 counts "7". Unless "7" is detected, the signal X7 output by the latch circuit 172 is at "L". When detecting "7", the latch circuit 172 changes its output level from "L" to "H". In response to the occurrence of X7, the control signals XCMP and YCMP are delayed by one clock period by the flip-flops 161 and 162, respectively. One of the NAND gates 151 and 153 outputs "H" when any one of the input signals becomes "L". The combination of the flip-flop 155 and the exclusive-OR gate 156 (157 and 158) becomes an inverted state of the state of the previous information. That is, the up count mode and the down count mode are interchanged.

The present invention is not limited to the specifically disclosed embodiments, and variations and modifications may be made without departing from the scope of the present invention.

What is claimed is:

1. A scan converter control circuit comprising:
first and second memories, each having a data write mode and a data read mode which are selected in response to a switching signal so that said first memory is in said data write mode when said second memory is in said data read mode and said first memory is in said data read mode when said second memory is in said data write mode;
write address counter means, operatively coupled to said first and second memories, for generating a write address which is to be alternately supplied to said first and second memories and for generating a write completion signal when the write address becomes equal to a predetermined count value;
read address counter means, operatively coupled to said first and second memories, for generating a read address which is to be alternately supplied to said first and second memories and for generating a read completion signal when the read address becomes equal to a predetermined count value;
data input control means, operatively coupled to said write address counter means, for enabling said write address counter means in response to a data input signal supplied from an external circuit and for disabling said write address counter means when receiving said write completion signal;
memory switching control means, operatively coupled to said first and second memories, for generating said switching signal having a logic value which is changed in response to said write completion signal; and
data output control means, operatively coupled to said write address counter means; said read address counter means and said first and second memories, for enabling said read address counter means in response to said write completion signal and for disabling said read address counter means in response to said read completion signal;
data is alternately written into and read out from said first and second memories for every n×n block having n×n pixel data, n being an integer,
said write address counter means generates said write address which scans said n×n block formed in one of said first and second memories which is in said write mode in a vertical direction of said n×n block; and
said read address counter means generates said read address which zigzag scans said n×n block formed in the other one of said first and second memories which is in said read mode along a diagonal of said n×n block.

2. A scan converter control circuit comprising:
first and second memories, each having a data write mode and a data read mode which are selected in response to a switching signal so that said first memory is in said data write mode when said second memory is in said data read mode and said first memory is in said data read mode when said second memory is in said data write mode;
write address counter means, operatively coupled to said first and second memories, for generating a write address which is to be alternately supplied to said first and second memories and for generating a write completion signal when the write address becomes equal to a predetermined count value;
read address counter means, operatively coupled to said first and second memories, for generating a read address which is to be alternately supplied to said first and second memories and for generating a read completion signal when the read addresses becomes equal to a predetermined count value;

data input control means, operatively coupled to said write address counter means, for enabling said write address counter means in response to a data input signal supplied from an external circuit and for disabling said write address counter means when receiving said write completion signal;

memory switching control means, operatively coupled to said first and second memories, for generating said switching signal having a logic value which is changed in response to said write completion signal; and data output control means, operatively coupled to said write address counter means, said read address counter means and said first and second memories, for enabling said read address counter means in response to said write completion signal and for disabling said read address counter means in response to said read completion signal;

data is alternately written into and read out from said first and second memories for every n×n pixel block having n×n pixel data, n being an integer;

said read address counter means generates said read address which scans said n×n pixel block formed in one of said first and second memories which is in said read mode in a vertical direction of said n×n pixel block; and said write address counter means generates said write address which zigzag scans said n×n pixel block formed in the other one of said first and second memories in said write mode along a diagonal of said n×n pixel block.

3. A scan converter control circuit comprising:

first and second memories, each having a data write mode and a data read mode which are selected in response to a switching signal so that said first memory is in said data write mode when said second memory is in said data read mode and said first memory is in said data read mode when said second memory is in said data write mode;

write address counter means, operatively coupled to said first and second memories, for generating a write address which is to be alternately supplied to said first and second memories and for generating a write completion signal when the write address becomes equal to a predetermined count value;

read address counter means, operatively coupled to said first and second memories, for generating a read address which is to be alternately supplied to said first and second memories and for generating a read completion signal when the read address becomes equal to a predetermined count value;

data input control means, operatively coupled to said write address counter means, for enabling said write address counter means in response to a data input signal supplied from an external circuit and for disabling said write address counter means when receiving said write completion signal;

memory switching control means, operatively coupled to said first and second memories, for generating said switching signal having a logic value which is changed in response to said write completion signal; and data output control means, operatively coupled to said write address counter means, said read address counter means and said first and second memories, for enabling said read address counter means in response to said write completion signal and for disabling said read address counter means in response to said read completion signal, wherein said write address counter means comprises:

first up/down counter means, having an up count mode and a down count mode selectively specified by a first instruction signal, for generating an X address in an X direction of an n×n pixel block by counting a clock signal and for generating a first underflow signal when said X address becomes equal to zero in said down count mode;

second up/down counter means, having an up count mode and a down count mode selectively specified by a second instruction signal, for generating a Y address in a Y direction of said n×n pixel block by counting said clock signal and for generating a second underflow signal when said Y address becomes equal to zero in said down count mode, said write address being composed of said X address and said Y address;

first comparator means, operatively coupled to said first up/down counter means, for comparing said X address with (n−1) and for generating a first coincidence direction signal when said X address becomes equal to (n−1);

second comparator means, operatively coupled to said second up/down counter means, for comparing said Y address with (n−1) and for generating a second coincidence detection signal when said Y address becomes equal to (n−1); and control means, coupled to said first and second up/down counter means and said first and second comparator means, for initially loading an initial value into said first and second up/down counter means, setting one of said first and second up/down counter means to said down count mode and setting the other one of said first and second up/down counter means to said up count mode and for disabling one of said first and second up/down counter means during a next clock period of said clock signal when said one of said first and second up/down counter means generates a corresponding one of the first and second underflow signals and simultaneously interchanging modes of said first and second up/down counter means.

4. A scan converter control circuit as claimed in claim 3, wherein said control means of said write address counter means comprises means for interchanging the modes of said first and second up/down counter means during a next clock period immediately after a count value in one of said first and second up/down counter means becomes equal to n and then one of said first and second comparator means related to one of said first and second up/down counter means in said up count mode generates a corresponding one of said first and second coincidence detection signals and for disabling, during a next clock period, said one of said first and second up/down counter means related to said one of said first and second comparators which generates said corresponding one of said first and second coincidence detection signals.

5. A scan converter control circuit as claimed in claim 4, wherein said control means of said write address counter means comprises means for disabling said first and second up/down counter means when counter values in said first and second up/down counter means respectively become equal to n.

6. A scan converter control circuit comprising:
first and second memories, each having a data write mode and a data read mode which are selected in response to a switching signal so that said first memory is in said data write mode when said second memory is in said data read mode and said first memory is in said data read mode when said second memory is in said data write mode;
write address counter means, operatively coupled to said first and second memories, for generating a write address which is to be alternately supplied to said first and second memories and for generating a write completion signal when the write address becomes equal to a predetermined count value;
read address counter means, operatively coupled to said first and second memories, for generating a read address which is to be alternately supplied to said first and second memories and for generating a read completion signal when the read address becomes equal to a predetermined count value;
data input control means, operatively coupled to said write address counter means, for enabling said write address counter means in response to a data input signal supplied from an external circuit and for disabling said write address counter means when receiving said write completion signal;
memory switching control means, operatively coupled to said first and second memories, for generating said switching signal having a logic value which is changed in response to said write completion signal; and
data output control means, operatively coupled to said write address counter means, said read address counter means and said first and second memories, for enabling said read address counter means in response to said write completion signal and for disabling said read address counter means in response to said read completion signal,
wherein said read address counter means comprises:
first up/down counter means, having an up count mode and a down count mode selectively specified by a first instruction signal, for generating an X address in an X direction of an $n \times n$ pixel block by counting a clock signal and for generating a first underflow signal when said X address becomes equal to zero in said down count mode;
second up/down counter means, having an up count mode and a down count mode selectively specified by a second instruction signal, for generating a Y address in a Y direction of said $n \times n$ pixel block by counting said clock signal and for generating a second underflow signal when said Y address becomes equal to zero in said down count mode, said read address being composed of said X address and said Y address;
first comparator means, operatively coupled to said first up/down counter means, for comparing said X address with $(n-1)$ and for generating a first coincidence detection signal when said X address becomes equal to $(n-1)$;
second comparator means, operatively coupled to said second up/down counter means, for comparing said Y address with $(n-1)$ and for generating a second coincidence detection signal when said Y address becomes equal to $(n-1)$; and
control means, coupled to said first and second up/down counter means and said first and second comparator means, for initially loading an initial value into said first and second up/down counter means, setting one of said first and second up down counter means to said down count mode and setting the other one of said first and second up/down counter means to said up count mode and for disabling one of said first and second up/down counter means during a next clock period of said clock signal when said one of said first and second up/down counter means generates a corresponding one of the first and second underflow signals and simultaneously interchanging modes of said first and second up/down counter means.

7. A scan converter control circuit as claimed in claim 6, wherein said control means of said read address counter means comprises means for interchanging the modes of said first and second up/down counter means during a next clock period immediately after a count value in one of said first and second up/down counter means becomes equal to n and then one of said first and second comparator means related to one of said first and second up/down counter means in said up count mode generates a corresponding one of said first and second coincidence detection signals and for disabling, during a next clock period, said one of said first and second up/down counter means related to said one of said first and second comparators which generates said corresponding one of said first and second coincidence detection signals.

8. A scan converter control circuit as claimed in claim 7, wherein said control means of said read address counter means comprises means for disabling said first and second up/down counter means when counter values in said first and second up/down counter means respectively become equal to n.

9. A zigzag address generator used for zigzag scanning an $n \times n$ pixel block, comprising:
first up/down counter means, having an up count mode and a down count mode selectively specified by a first instruction signal, for generating an X address in an X direction of the $n \times n$ pixel block by counting a clock signal and for generating a first underflow signal when said X address becomes equal to zero in said down count mode;
second up/down counter means, having an up count mode and a down count mode selectively specified by a second instruction signal, for generating a Y address in a Y direction of the $n \times n$ pixel block by counting said clock signal and for generating a second underflow signal when said Y address becomes equal to zero in said down count mode;
first comparator means, operatively coupled to said first up/down counter means, for comparing said X address with $(n-1)$ and for generating a first coincidence detection signal when said X address becomes equal to $(n-1)$;
second comparator means, operatively coupled to said second up/down counter means, for comparing said Y address with $(n-1)$ and for generating a second coincidence detection signal when said Y address becomes equal to $(n-1)$; and
control means, coupled to said first and second up/down counter means and said first and second comparator means, for initially loading an initial value into said first and second up/down counter means, setting one of said first and second up/down counter means to said down count mode and setting the other one of said first and second up/down counter means to said up count mode and for disabling one of said first and second up/down counter means during a next clock period of said clock signal when said one of said first and second up/down counter means generates a corresponding one of said first and second underflow signals and simultaneously interchanging modes of said first and second up/down counter means.

10. A zigzag address generator as claimed in claim 9, wherein said control means comprises means for interchanging the modes of said first and second up/down counter means during a next clock period immediately after a count value in one of said first and second up/down counter means becomes equal to n and then one of said first and second comparator means related to one of said first and second up/down counter means in said up count mode generates a corresponding one of said first and second coincidence detection signals and for disabling, during a next clock period, said one of said first and second up/down counter means related to said one of said first and second comparators which generates said corresponding one of said first and second coincidence detection signals.

11. A zigzag address generator as claimed in claim 10, wherein said control means comprises means for disabling said first and second up/down counter means when counter values in said first and second up/down counter means respectively become equal to n.

* * * * *

UNITED STATES PATENT AND TRADEMARK OFFICE
CERTIFICATE OF CORRECTION

PATENT NO. : 5,313,299
DATED : MAY 17, 1994
INVENTOR(S) : TERUO ISHIHARA

Figure 1:
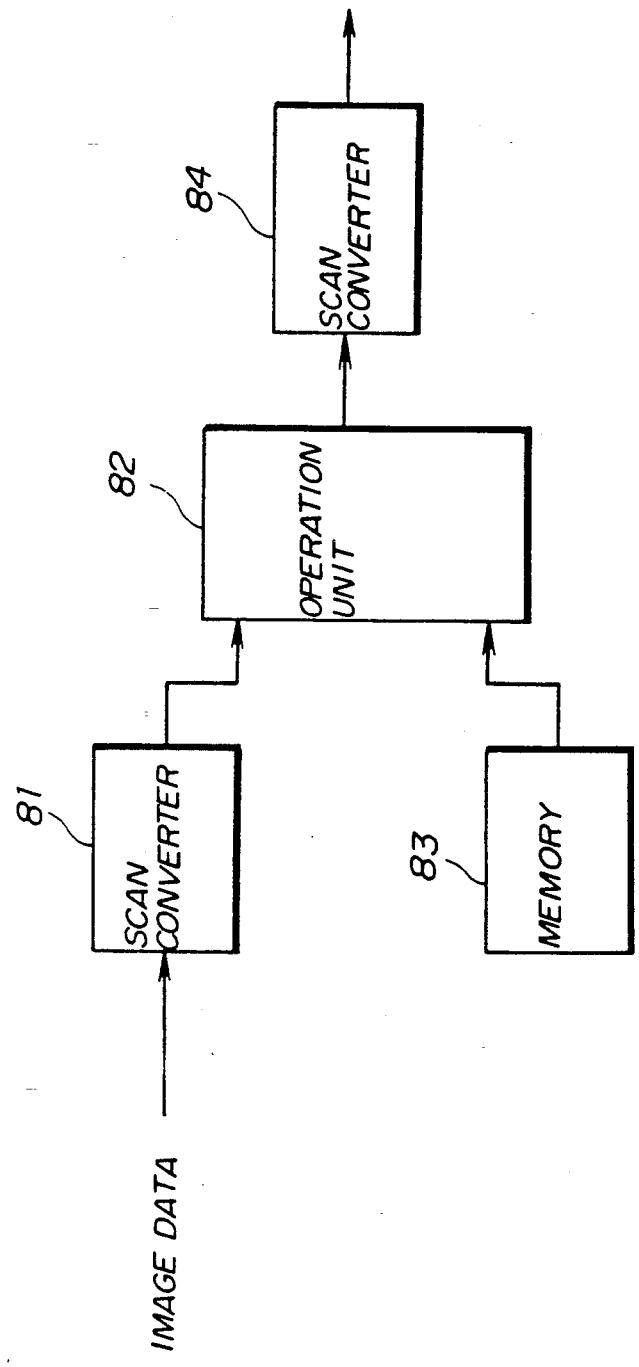
FIG. 1 is a prior art block diagram of a DCT coding circuit.

It is certified that error appears in the above-indentified patent and that said Letters Patent is hereby corrected as shown below:

Col. 3, line 55, after "FIG. 1 is a" delete "prior art" and re-insert before "DCT".

Col. 4, line 4, change "(C)" to --(D)-- and after "of" insert --the--.

Col. 16, line 41, after "integer" change "," to --;--.

Signed and Sealed this

Sixth Day of September, 1994

Attest:

BRUCE LEHMAN

*Attesting Officer*     *Commissioner of Patents and Trademarks*